United States Patent
Duan et al.

(10) Patent No.: US 12,126,098 B2
(45) Date of Patent: *Oct. 22, 2024

(54) RF MODULES WITH AN ENCLOSURE HAVING A MICROMACHINED INTERIOR USING SEMICONDUCTOR FABRICATION

(71) Applicant: Northrop Grumman Systems Corporation, Falls Church, VA (US)

(72) Inventors: Dah-Weih Duan, Torrance, CA (US); Elizabeth T Kunkee, Manhattan Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 135 days.

This patent is subject to a terminal disclaimer.

(21) Appl. No.: 17/899,750

(22) Filed: Aug. 31, 2022

(65) Prior Publication Data

US 2024/0106123 A1    Mar. 28, 2024

Related U.S. Application Data

(63) Continuation-in-part of application No. 16/860,642, filed on Apr. 28, 2020, now Pat. No. 11,470,695.

(51) Int. Cl.
*H01Q 9/04* (2006.01)
*C23C 14/02* (2006.01)
(Continued)

(52) U.S. Cl.
CPC .......... *H01Q 9/0407* (2013.01); *C23C 14/022* (2013.01); *C23C 14/185* (2013.01);
(Continued)

(58) Field of Classification Search
CPC ...... H01Q 9/0407; H01Q 1/48; C23C 14/022; C23C 14/185; C23C 14/34; C23C 28/023;
(Continued)

(56) References Cited

U.S. PATENT DOCUMENTS

| 5,319,329 A | 6/1994 | Shiau et al. |
| 6,128,195 A | 10/2000 | Weber et al. |

(Continued)

FOREIGN PATENT DOCUMENTS

| CN | 101420056 | 4/2009 |
| CN | 102354783 | 2/2012 |

(Continued)

OTHER PUBLICATIONS

International Preliminary Report on Patentability in related Application Serial No. PCT/US2021/031224, issued on Jan. 26, 2023, 10 pages.

(Continued)

*Primary Examiner* — Abdullah A Riyami
*Assistant Examiner* — Syed M Kaiser
(74) *Attorney, Agent, or Firm* — KLINTWORTH & ROZENBLAT IP LLP

(57) ABSTRACT

An exemplary RF module includes a dielectric substrate with metal traces on one surface that connect high frequency components and provide reference ground. Other metal traces on the other surface of the substrate also provide high frequency transmission lines and reference ground. An enclosure made using semiconductor manufacturing technology is mounted to the substrate and has conductive interior recesses defined by extending walls that are connected to the reference ground. The recesses surround the respective components and provide electromagnetic shielding. The dimensional precision in the location and smoothness of the walls and recesses due to the semiconductor manufacturing technology provides repeatable unit-to-unit RF characteristics of the RF module. One way of mounting the enclosure to the substrate uses a plurality of metal bonding bumps extending outwardly from the walls to engage reference ground metal traces on the substrate.

(Continued)

Applied pressure deforms the bonding bumps to form a metal-to-metal bond.

18 Claims, 16 Drawing Sheets

(51) Int. Cl.
    *C23C 14/18*     (2006.01)
    *C23C 14/34*     (2006.01)
    *C23C 28/02*     (2006.01)
    *C25D 3/48*     (2006.01)
    *C25D 5/54*     (2006.01)
    *C25D 7/12*     (2006.01)
    *H01Q 1/48*     (2006.01)

(52) U.S. Cl.
    CPC ............ *C23C 14/34* (2013.01); *C23C 28/023* (2013.01); *C25D 3/48* (2013.01); *C25D 5/54* (2013.01); *C25D 7/123* (2013.01); *H01Q 1/48* (2013.01)

(58) Field of Classification Search
    CPC .. C25D 3/48; C25D 5/54; C25D 7/123; H01P 1/2135; H01P 11/007; H01P 1/203
    See application file for complete search history.

(56) References Cited

U.S. PATENT DOCUMENTS

| | | | |
|---|---|---|---|
| 6,522,214 | B1 | 2/2003 | Harju et al. |
| 6,734,750 | B1 | 5/2004 | Ostergaard |
| 9,627,736 | B1 | 4/2017 | Ingalls |
| 9,761,547 | B1 | 9/2017 | Kunkee et al. |
| 9,865,909 | B2 | 1/2018 | Chan |
| 10,153,222 | B2 | 12/2018 | Yu et al. |
| 11,470,695 | B2 * | 10/2022 | Kunkee ................... H05B 6/80 |
| 2003/0206261 | A1 | 6/2003 | Cahill |
| 2007/0048898 | A1 | 3/2007 | Carlson et al. |
| 2008/0001241 | A1 * | 1/2008 | Tuckerman ......... H01L 31/0203 257/434 |
| 2008/0002460 | A1 * | 1/2008 | Tuckerman ......... H01L 31/0203 257/E23.079 |
| 2010/0148293 | A1 | 6/2010 | Jain et al. |
| 2012/0094442 | A1 * | 4/2012 | Lin ........................ H05K 1/021 438/118 |
| 2016/0030965 | A1 | 4/2016 | Lin |
| 2018/0352651 | A1 * | 12/2018 | Tazzoli ................. H05K 1/115 |
| 2019/0081380 | A1 * | 3/2019 | Bates ................. H01L 23/5387 |
| 2020/0091608 | A1 * | 3/2020 | Alpman ................. H01Q 21/24 |
| 2020/0075503 | A1 | 5/2020 | Chuang et al. |

FOREIGN PATENT DOCUMENTS

| | | |
|---|---|---|
| CN | 108074872 | 4/2018 |
| CN | 108598638 | 9/2018 |
| WO | WO 2007-103224 | 9/2007 |
| WO | WO 2016133457 | 8/2016 |

OTHER PUBLICATIONS

Song Lin, Development of an Ultra-Wideband Suspended Stripline to Shielded Microstrip Transition, IEEE Microwave and Wireless Components Letters, vol. 21, No. 9, Sep. 2011, pp. 474-476.
Young-Gon Kim and Kang Wook Kim, A New Design Method for Ultra-Wideband Microstrip-to-Suspended Stripline Transitions, Machine Copy for Proofreading, vol. x, y-z, 2013, pp. 1-14.
Dr. Burhan Bayraktaroglu, Heterogeneous Integration Technology, Final Report, Aug. 2017, 108 pages.
Yuan Li, Pete L. Kirby, and John Papapolymerou, Silicon Micromachined W-Band Bandpass Filter Using DRIE Technique, Proceedings of the 36th European Microwave Conference, Sep. 2006, Manchester UK, pp. 1271-1273.
John C. Tippet and Ming J. Shiau, Circuit Transformations for Realization of a Class of Miniature Printed Circuit Filters, IEEE MTT-S Digest, 1994, pp. 621-624.
Mingqi Chen, A 1-25 GHZ GaN HEMT MMIC Low-Noise Amplifier, IEEE Microwave and Wireless Components Letters, vol. 20, No. 10, Oct. 2010, pp. 563-565.
Yemin Tang, et al., Ultra Deep Reactive Ion Etching of High Aspect-Ratio and Thick Silicon Using a Ramped-Parameter Process, Journal of Microelectromechanical Systems, vol. 27, No. 4, Aug. 2018, pp. 686-697.
Vesna Radisic, et al., Heterogeneously Integrated V-Band Amplifier, IEEE/MTT-S International Microwave Symposium, 2018, pp. 289-292.
Wolfgang Menzel, Quasi-Lumped Suspended Stripline Filters and Diplexers, IEEE Transactions on Microwave Theory and Techniques, vol. 53, No. 10, Oct. 2005, pp. 3230-3237.
Kenjiro Nishikawa, et al., Compact 60-GHz LTCC Stripline Parallel-coupled Bandpass Filter with Parasitic Elements for Millimeter-wave System-on-Package, NTT Network Innovation Laboratories, NTT Corporation, Japan, IEEE, 2007, pp. 1649-1652.
Jian-Xing Zhuang, Silicon Micromachined Terahertz Bandpass Filter With Elliptic Cavities, IEEE Transactions on Terahertz Science and Technology, vol. 5, No. 6, Nov. 2015, pp. 1040-1047.
Jiunnjye Tsaur, et al, A Ground Shielded Low Loss Transmissi163-166On Line Using Au-to-Au Therm0 Compressive Packaging for RF Applications, IEEE, 2005, pp. 163-166.
Soon Young Eom et al., Compact Broadband Microstrip Crossover With Isolation Improvement and Phase Compensation, IEEE Microwave and Wireless Components Letters, vol. 24, No. 7, Jul. 2014, pp. 481-483.
Jeong-Geun Kim et al., Miniature Four-Way and Two-Way 24 GHz Wilkinson Power Dividers in 0.13 μm CMOS, IEEE Microwave and Wireless Components Letters, vol. 17, No. 9, Sep. 2007, pp. 658-660.
Adel A. M. Saleh, Planar Electrically Symmetric n-Way Hybrid Power Dividers/Combiners, IEEE Transactions on Microwave Theory and Techniques, vol. MTT-28, No. 6, Jun. 1980, pp. 555-563.
Soumendu Sinha, et al., Design and Optimization of RF MEMS T-Type Switch for Redundancy Switch Matrix Applications, 2012 International Conference On Computing, Electronics and Electrical Technologies [ICCEET], 2012, pp. 501-508.
Yana Taryana et al., Four Way Power Divider Using Wilkinson Method for X-Band Radar, 2019 International Conference on Radar, Antenna, Microwave, Electronics, and Telecommunications, 2019, pp. 41-45.
Ernest J. Wilkinson, An N-Way Hybrid Power Divider, IRE Transactions on Microwave Theory and Techniques, Jan. 1960, pp. 116-118.
Liu Xin et al., A Novel Compact Planar Crossover With Simple Design Procedure, Proceedings of Asia-Pacific Microwave Conference 2010, pp. 1633-1636.
International Search Report in related Application Serial No. PCT/US2021/015211, issued on Apr. 20, 2021, 28 pages.
International Search Report in related Application Serial No. PCT/US2021/031224, issued on Jul. 19, 2021, 27 pages.
Hsieh et al., Design of Ku-Band SIR Interdigital Bandpass Filter Using Silicon-Based Micromachining Technology, Silicon Monolithic Integrated Circuits in RF Systems (SIRF), 2010 Topical Meeting on, IEEE, Jan. 11, 2010, pp. 104-107.
Mokhtaari et al., Ultra-wideband and notched wideband filters with grounded vias in microstrip technology, Microwave Conference, 2008. AMPC 20008. Asia-Pacific, IEEE, Dec. 16, 2008, pp. 1-4.
Stephen V. Robertson et al., Micromachined Self-Packaged W-Bandpass Filters, IEEE MTT-S International Microwave Symposium Digest. Orlando, May 16-20, 1995; IEEE MTT-S International Microwave Symposium Digest, May 16, 1995, vol. 3, pp. 1543-1546.
Invitation to Pay Additional Fees in related Application Serial No. PCT/US2022/015204. issued on May 23, 2022, 16 pages.
International Search Report in related Application Serial No. PCT/US2022/016263, issued on Jul. 22, 2022, 20 pages.

(56) References Cited

OTHER PUBLICATIONS

International Search Report in related Application Serial No. PCT/US2022/015205, issued on Jul. 14, 2022, 22 pages.

Elizabeth T. Kunkee, D. Duan, A. Sulian, P. Ngo, N. Lin, C. Zhang, D. Ferizovic, C. M. Jackson, and R. Lai, "Suspended SiC Filter with DRIE Silicon Subcover," IEEE International Microwave Symposium, Paper We32-293, Jun. 21, 2020. IEEE-MTT Industry Paper Finalist; pp. 1051-1054.

* cited by examiner ures. The coating is removed and the entirety of the exposed surface of the silicon wafer is sputtered preferably with gold so that sputtered gold coats the ends of the walls, bottom of the recesses, and the sides of the walls. The area covered by sputtered gold with gold is then plated with gold.

RF MODULES WITH AN ENCLOSURE HAVING A MICROMACHINED INTERIOR USING SEMICONDUCTOR FABRICATION

RELATED APPLICATIONS

This application is a continuation-in-part of U.S. patent application Ser. No. 16/860,642 entitled "FILTER WITH AN ENCLOSURE HAVING A MICROMACHINED INTERIOR USING SEMICONDUCTOR FABRICATION" filed Apr. 28, 2020, the entire contents of which are incorporated herein by reference.

BACKGROUND

Embodiments of the invention relate to RF modules with active and/or passive devices made using semiconductor fabrication technology with an enclosure composed of micromachined interiors that enhance the performance of the active and passive RF devices and provide manufacturability that yields repeatable unit-to-unit performance results.

High-frequency, i.e., frequencies of 1 GHz and higher, active devices and filters have been constructed using a variety of materials and techniques. However, producing devices and filters with a high Q and low insertion loss that are stable over temperature extremes is challenging. It is further challenging to design an RF module that packages such high-frequency devices and filters to provide desirable RF isolation and to be able to be manufactured to repeatedly yield virtually the same performance characteristics. There exists a need for devices and filters that substantially overcome these challenges and methods to package such devices and filters.

SUMMARY

It is an object of embodiments of the present invention to provide RF modules that substantially satisfy these challenges.

An exemplary RF module includes a dielectric substrate with metal traces on one surface that connect high frequency components and provide reference ground. Other metal traces on the other surface of the substrate also provide reference ground. An enclosure made using semiconductor manufacturing technology is mounted to the substrate and has conductive interior recesses defined by extending walls that are connected to the reference ground. The recesses surround the respective components and provide electromagnetic shielding. The dimensional precision in the location and smoothness of the walls and recesses due to the manufacturer of the enclosure using semiconductor technology provides repeatable unit-to-unit RF characteristics of the RF module. One way of mounting the enclosure to the substrate uses a plurality of metal bonding bumps extending outwardly from the walls to engage reference ground metal traces on the substrate. Applied pressure and heat deforms the bonding bumps to form a metal-to-metal bond.

An exemplary method for manufacturing a semiconductor technology implemented enclosure is described that provides electromagnetic shielding of high frequency RF components disposed on a substrate when the enclosure engages the substrate. A coating is applied to areas on a major surface of a silicon wafer where the areas define where walls of recesses will be located. A layer of silicon not protected by the coating is etched away to a first depth, where the silicon at the first depth defines the bottom of the respective recesses. The coating is removed and the entirety of the exposed surface of the silicon wafer is sputtered preferably with gold so that sputtered gold coats the ends of the walls, bottom of the recesses, and the sides of the walls. The area covered by sputtered gold with gold is then plated with gold.

An exemplary enclosure is made using semiconductor technology and provides electromagnetic shielding of electronic RF sensitive components disposed on a substantially planar dielectric substrate with metal traces disposed on at least one major surface of the substrate. The RF sensitive components can include both filters and passives, as well as active devices such as MMIC and digital chips. The enclosure is made from a dielectric wafer having a micromachined semiconductor fabricated interior that includes recesses that are defined between outwardly extending peripheral walls. The peripheral walls have substantially planar end areas that are parallel to each other and are in the same plane. The recesses are dimensioned to surround and provide electromagnetic isolation for the respective electronic components when the planar end areas of enclosure engage the ground reference traces on the surface of the substrate. A conductive metal coating is deposited on all interior surfaces of the enclosure including the substantially planar end areas and the recesses. The substantially planar end areas are dimensioned to engage and make electrical connection with the reference ground metal traces on the surface of the substrate so that, when engaged, the interior recesses form part of the reference ground to provide electromagnetic shielding of the components. To preferably enhance the electromagnetic shield, the reference ground metal traces on the surface of the substrate are connected to the ground plane on the back side of the substrate using through-wafer vias. Altogether, from bottom up, the back side metal, the through-wafer vias, the ground metal traces on the surface of the substrate, the bonding bumps, the conductive metal on the substantially planar end areas of the enclosure, and the metallization on the interior recesses provide electromagnetic shielding (e.g., a "Faraday cage") of the enclosed components.

DESCRIPTION OF THE DRAWINGS

Features of exemplary embodiments of the invention will become apparent from the description, the claims, and the accompanying drawings in which:

DETAILED DESCRIPTION

One aspect of the present invention resides in the recognition of the difficulties associated with repeatably manufacturing a conductive enclosure for elements that make up a RF module including substrates, filters, and active MMIC components. The conductive enclosure must provide an effective ground structure for currents along the entirety of surrounding interior walls. The recognition of such difficulties gives rise to an enclosure design that can be reliably and repeatedly manufactured to provide an effective continuous ground structure about the periphery of the assembled enclosure as well as linking top and bottom metallization ground traces. Details concerning the overcoming of these difficulties will be recognized by those of ordinary skill in the art in view of the following description.

An exemplary embodiment of a diplexer is used as one example of a passive RF module to convey the features and improvements associated with embodiments of the present invention. A diplexer functions as one type of filter which separates an incoming signal at a single input into two separate outputs, with one output containing input signals having a frequency within a first frequency range and the other output containing input signals having a frequency within a second frequency range, where the first and second frequency ranges are different. As used herein, "filter" is utilized to refer to any type of frequency selective circuitry in RF, microwave or millimeter wave regime suitable for disposition on a substrate that can be disposed within an enclosure. For example, a filter can include, but is not limited to, a diplexer, low pass filter, high pass filter, bandpass filter, multi-function filters, multi-band filters, power dividers/combiners, resonators, couplers, spiral/coil/toroid inductors, metal-insulator-metal (MIM) capacitors, interdigitated capacitors, vertical (i.e., between-via) capacitors, baluns, attenuators, phase shifters, any layer-to-layer transitions, same layer but line type to line type transitions, etc.

Figure 1:
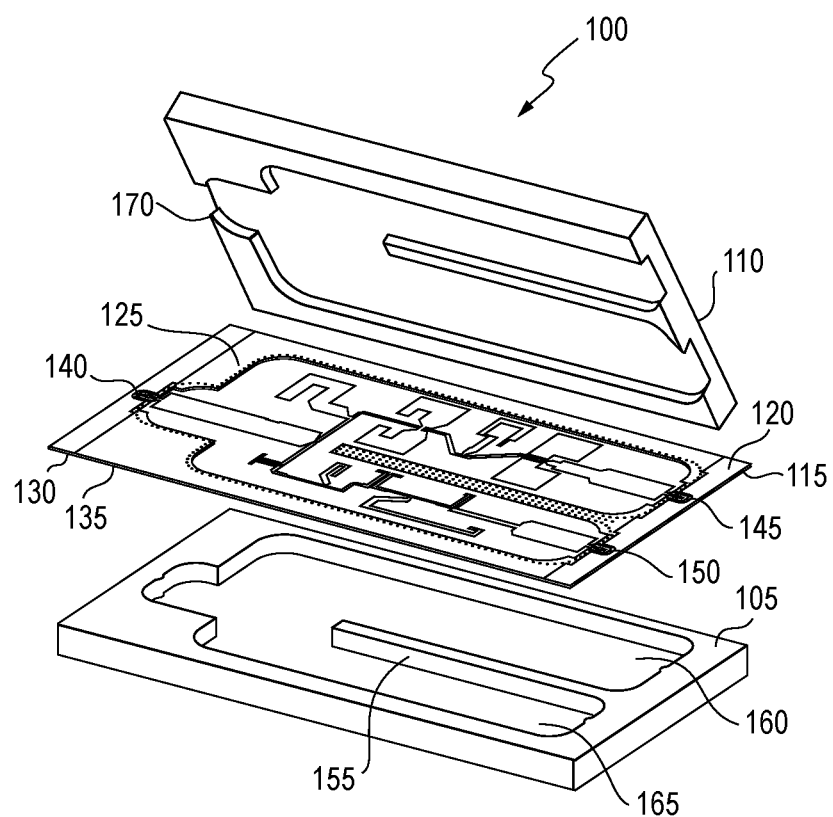
FIG. 1 shows a disassembled perspective view of a filter in accordance with an embodiment of the present invention.

FIG. 1 shows an exemplary embodiment 100 of a filter, i.e. diplexer, having a two-piece enclosure consisting of a bottom enclosure 105 and a top enclosure 110. A substantially planar substrate 115 is sized to be encapsulated like a sandwich between the bottom enclosure 105 and the top enclosure 110 in a ready-for-operation assembly. The substrate 115 has a top surface 120 that supports top metallization 125 and a bottom surface 130 that supports bottom metallization 135. An input port 140 receives the input signal with frequency selective circuitry routing signals in one frequency range to output port 145 while frequencies of another frequency range are routed to output port 150. The bottom enclosure 105 contains an internal recessed area that is partially divided by a longitudinal centered peninsula 155 that separates a recessed area 160 which is associated with output port 145 and recessed area 165 which is associated with output port 150. The upper peripheral surfaces on both the bottom enclosure 105 and the upper surface of peninsula 155 represent a reference ground (potential). The top enclosure 110 is substantially similar to the bottom enclosure except that a cutout portion 170 is disposed to be adjacent to the input port 140 in the assembled position. The cutout portion 170 facilitates the coupling of an input signal by an external probe or line by providing a mechanical support to the input port 140 on the substrate 115. Similarly, cutout portions in the top enclosure opposite the output ports 145 and 150 facilitate clearance for connections with these ports. When assembled, the peninsula 155 engages the substrate 115 on one surface and the corresponding peninsula on the top enclosure engages the substrate 115 on the other surface so as to oppose peninsula 155 and, when interconnected by the through-substrate vias, form two parallel recessed cavities separated by two opposing peninsulas. The grounding structure formed by the two peninsula and the through-substrate vias serves as the microwave isolation wall between the two recessed cavities ("channels") in this exemplary filter. Note that a peninsula is an interior wall in a cover. A cover could also have "islands" in addition to peninsulas. When the interior and the projecting surfaces of a cover are metallized, islands and peninsula are also metalized likewise at the same time. They provide "inner" interior walls, typically for the purpose of isolation, de-moding, field-shaping and impedance control. It should be noted that the interior walls including those contributed by the islands and peninsula, the recessed surfaces, the projecting surfaces and the bonding bumps of both covers and the through-substrate vias are all part of the ground reference structure. When assembled, these form a singly connected ground structure, or a "Faraday cage", for the enclosed stripline circuit. Islands and peninsula may have any different, contoured perimeters, which presents no difficulty to the manufacturing technology.

The exemplary diplexer 100 is designed to route input signals at input port 140 with frequencies that are between 0.5 GHz to 10 GHz along a first path to a first output 145 while separating input signals that are between 11 GHz to 20 GHz along a second path to a second output 150. Circuitry associated with the first and second paths provide low insertion loss for the signals that are to be coupled to the respective first and second outputs while providing a substantially high impedance to the other signals that are not desired to be coupled through the respective paths. At such frequencies the exemplary circuitry is implemented by respective metallization traces that function as the equivalent of capacitors, inductors and transmission lines to provide frequency selection.

Figure 2:
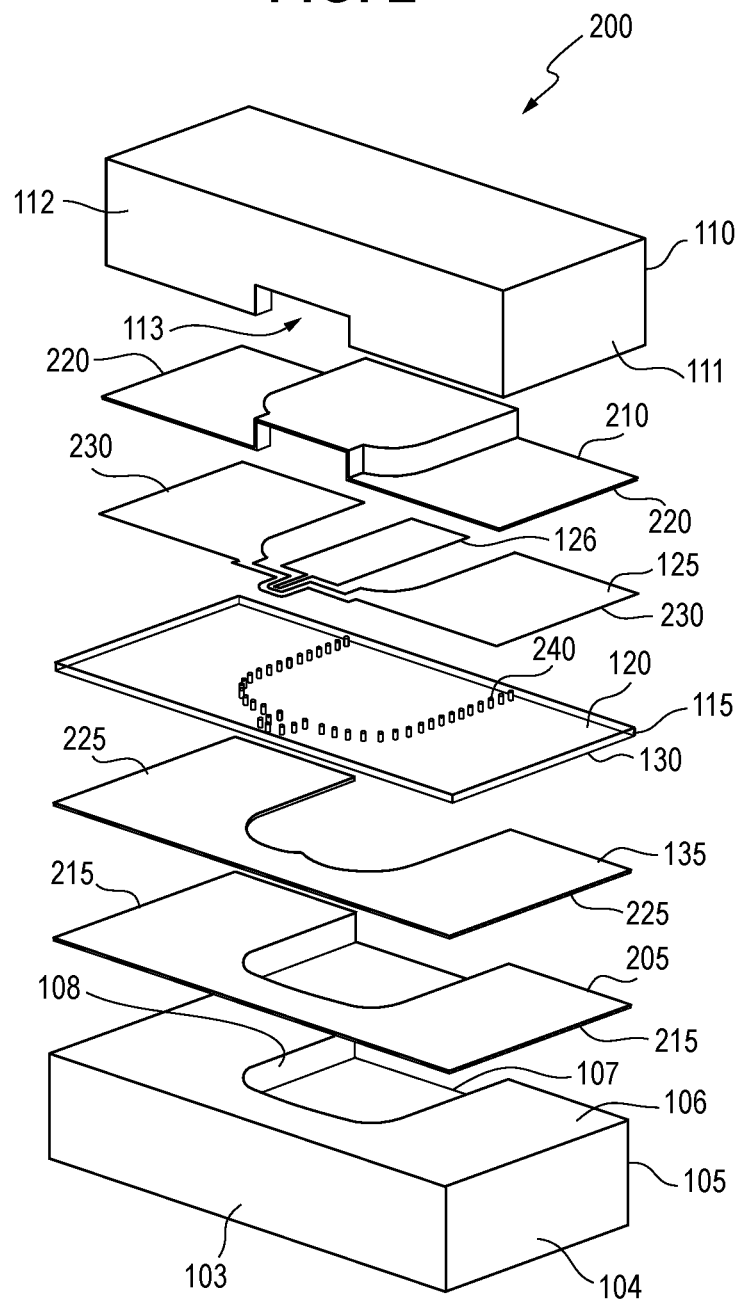
FIG. 2 shows an exploded view of a filter in accordance with an embodiment of the present invention showing the relationship among elements and layers.

FIG. 2 shows a representative exploded view of the exemplary filter (diplexer) 200 in which the elements described in FIG. 1 are shown and identified by the same reference numerals. Bottom layer 205 and top layer 210 represent deposited conductive metal layers on the interior surfaces of the bottom enclosure 105 and top enclosure 110, respectively. The longitudinal peripheries 215 of bottom layer 205 and the longitudinal peripheries 220 of top layer 210 extend to longitudinal edges of the internal surfaces of the bottom enclosure 105 and top enclosure 110, respectively. Likewise, the longitudinal peripheries 225 of bottom metallization 135 and the longitudinal peripheries 230 of top metallization 125 extend to the longitudinal edges of the internal surfaces of bottom enclosure 105 and top enclosure 110, respectively. The peripheries 225 and 230 of the bottom and top metallization layers 135 and 125 on the substrate represent metallization for which reference ground is desired. The top metallization layer also includes signal traces 126 that transport the input signal relative to the reference ground. A plurality of metallized through-hole vias 240 along the longitudinal peripheries of substrate 120 provide an effective ground connection between respective mating areas of mating bottom and top metallization layers 135 and 125. In order to establish an effective ground, the vias 240 should be of suitable spacing for the electromagnetic frequency under consideration in order to prevent moding, which is an undesired electromagnetic resonance that occurs in the empty space ("cavity") formed by surrounding vias when energy of the resonant frequency of that cavity is coupled into the cavity. Typically, the via spacing is chosen to be no more than a small fraction, say, ⅕ to ¹⁄₁₀ of a quarter wavelength (one fourth of a wavelength) of the highest frequency under consideration. For example, to prevent moding at frequencies under 20 GHz, a spacing of 750 µm to 375 µm will suffice. In order to enhance the effective grounding, vias 240 are disposed interior within substrate 120 to engage close to the interior edges of the ground metallization of the bottom metallic layer 135 and also with opposing ground areas on the top metallic layer 125. The bottom deposited metal layer 205 is contiguous within the internal surfaces of the bottom enclosure 105. That is, a continuous deposited metal layer exists on the top surface 106, the top 107 of an interior recess that defines an interior space, and the substantially vertical sidewalls 108 between surfaces 106 and 107. The top deposited metal layer 210 is also contiguous as similarly explained for the bottom deposited metal layer. The bottom enclosure 105 includes 2 longitudinal sidewalls 104 and 2 end walls 103 that are perpendicular to the sidewalls. The top enclosure 110 includes 2 longitudinal sidewalls 111 and 2 end walls 112 that are perpendicular to the sidewalls 111. In the illustrated diplexer example, open portions 113 in the end walls 112 extend from the outside edge of the end wall substantially perpendicular back into the interior to adjoin the major interior recesses.

Figure 3:
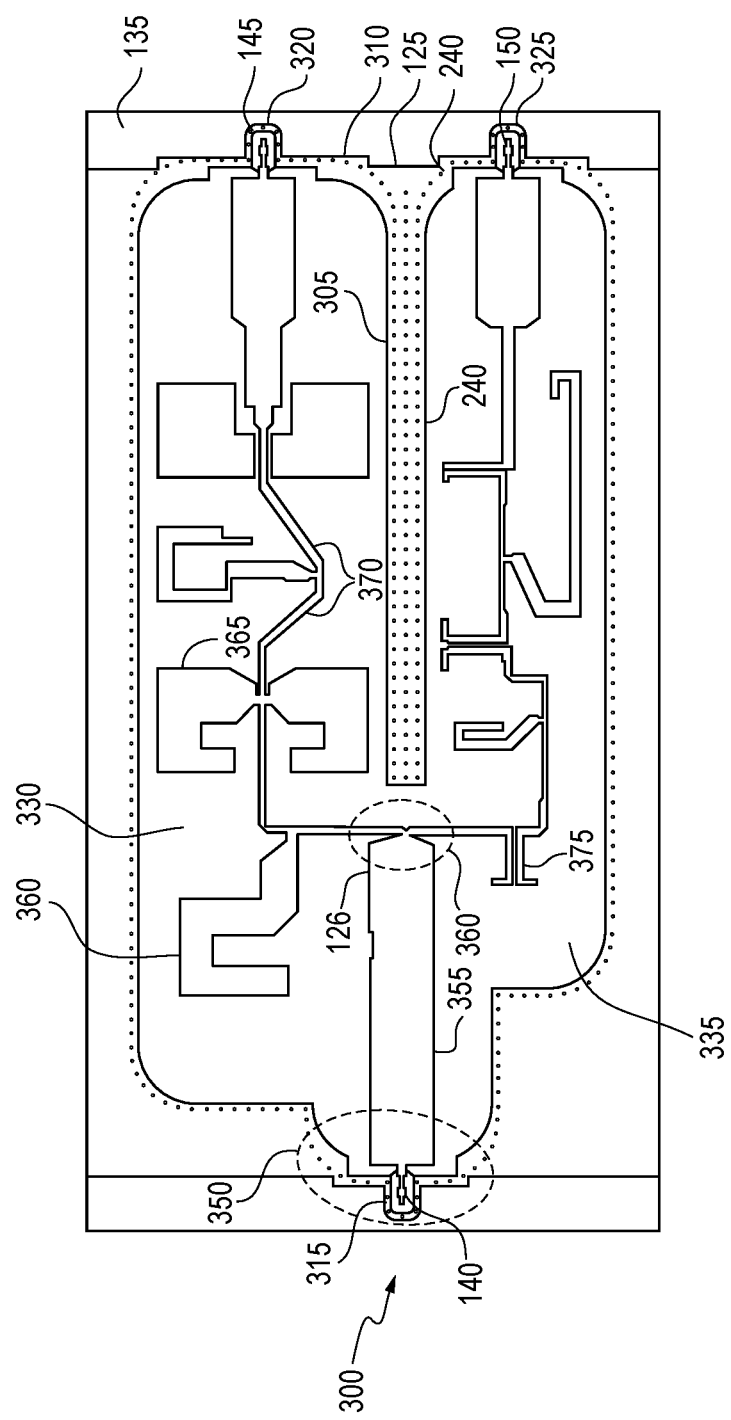
FIG. 3 shows a top view of metallization disposed on a top of a substrate relative to bottom side metallization.
Figure 4:
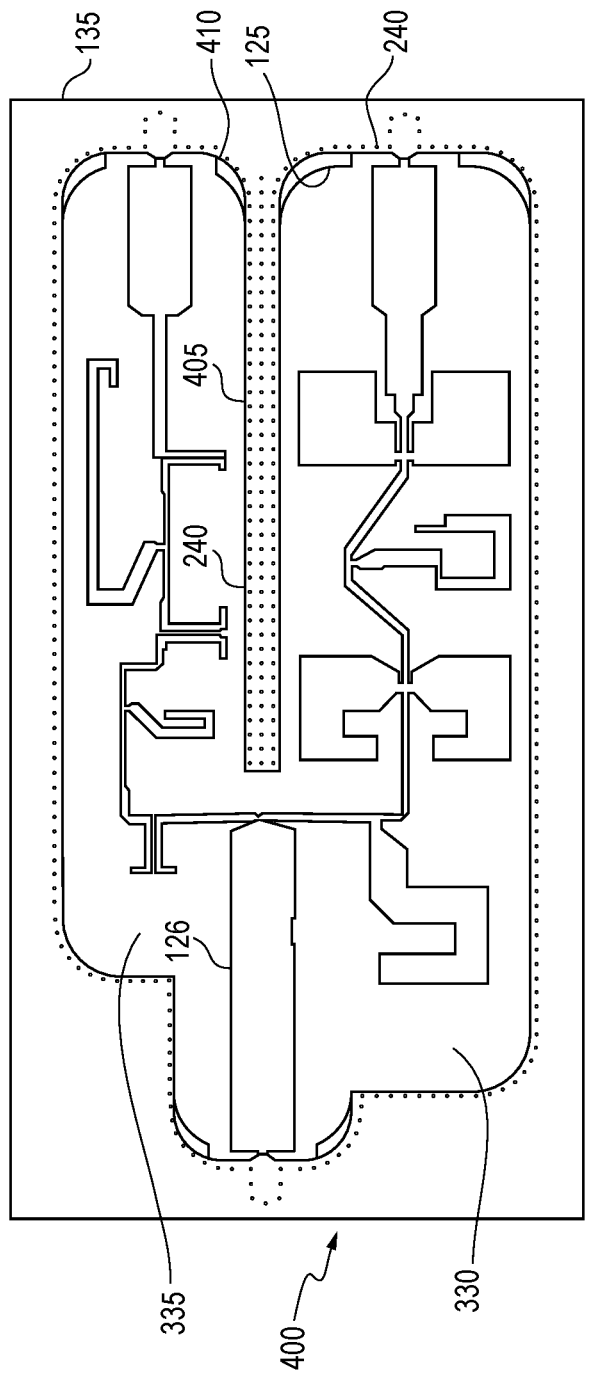
FIG. 4 shows a bottom view of metallization disposed on the bottom of the substrate relative to the top side metallization.

FIGS. 3 and 4 show top 300 and bottom 400 views of just the metallization that is disposed on top and bottom of a substrate, respectively. When assembled, the peninsula 155 engages the ground metallization on substrate 115 on one surface and the corresponding peninsula on the top enclosure engages the ground metallization on substrate 115 on the other surface so as to oppose peninsula 155 and, when interconnected by the through-substrate vias, form two parallel recessed cavities separated by two opposing peninsulas. The view as seen in FIG. 4 shows a bottom view of metallization on the bottom surface of the substrate with the view as shown in FIG. 3 rotated longitudinally 180°. The ground potential peninsula 305 is located on the top metal layer directly above the ground potential peninsula 405 on the bottom metal layer. A plurality of through-hole vias 310 in the top metal layer correspond to and are substantially identical with the through hole vias 410 in the bottom metal layer to establish a connection through the substrate between the top and bottom metal layers. A plurality of vias extend all along the width and length of the upper and lower metallization peninsulas in order to establish common ground potential between the top and bottom metal peninsula layers. A U-shaped metal loop 315 at ground potential extends around and completely encloses the input port 140. Similarly, U-shaped metal loops 320 and 325 of ground potential also enclose the output ports 145 and 150, respectively. This U-shaped loop is a feature in the probe-microstrip-stripline transition for the exemplary filter that helps minimize wave leakage in the space between the probe and the substrate going in the opposite direction to the desired direction (into the suspended stripline). Note that in other transition designs, e.g. ribbon bonding or dual-purpose (probing and ribbon bonding), utilizing a such a ground loop may not be needed or preferred. This ground loop is not a required feature of the current suspended stripline technology although it enhances a high performance wide band transition for probe-measuring.

Figure 7:
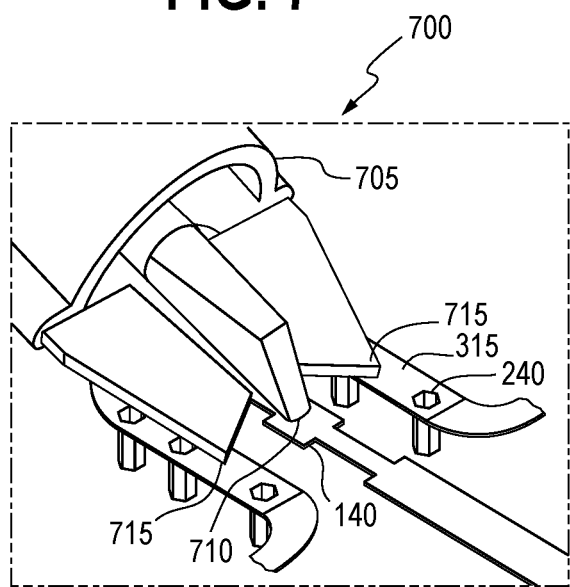
FIG. 7 shows an enlarged detail of topside metallization associated with the coupling of signals to and from the filter.

A general explanation of the circuitry implemented by the traces as shown in FIG. 3 is provided. However, those skilled in the art will understand that this explanation applies to the specific exemplary diplexer and that various other types of filter elements can be deployed on the substrate to provide frequency selective circuitry including transmission lines, inductive components, capacitive components, distributed components, and coupling components. Such components can be designed to provide various functions, e.g. low-pass filters, high-pass filters, bandpass filters and notch filters, etc. and can include multiple input and/or output ports. Additionally, active circuit elements, e.g. transistors, ICs, etc., could also be deployed on a supporting substrate contained within the enclosures. An input transition 350 facilitates a wide bandwidth accommodation between a microstrip contained between the probe as shown in FIG. 7 and strip line 355. If the microstrip and strip line both have 50-ohm transmission impedance, a representative microstrip will have a centerline conductor width of about 3 mil while the suspended strip line 355 will be 60 mil. Additionally, the electromagnetic field in the microstrip is mainly contained under the microstrip line while the electromagnetic field in the suspended strip line 355 spreads in all directions transverse to the direction of propagation, from the signal metal traces all the way to the interior walls of the covers. The transition 350 uses a wedge-shaped metallization on the bottom of the substrate and a contoured metal lining in the adjacent covers to assist in fanning out the field from the tightly confined microstrip mode to the substantially large cavity of the suspended strip line in a short distance. A tapering of the enclosure from a regular channel width down to the size of the opening 113 is designed to work with the wedge-shaped metallization for the same purpose of helping fan out the field for high performance wide band transition. Also, a neck-down matching section (see the narrowed section in FIG. 7) and a tail-end section behind the probe pad also help to achieve wideband performance for up to 40 GHz. The region 360 represents a common signal junction where the input signals are coupled by transmission line 355 to 2 transmission lines coupled to the top and bottom frequency selective circuitry, respectively. Elements 360, 365 and alike function as open stub transmission lines associated with tuning to provide a notch frequency response. Element 370 represents connecting transmission lines. The circuit elements residing above the transmission line 355 and peninsula 305 combine to provide a frequency response of a low-pass filter, e.g. 0.5 GHz-10 GHz signals are passed with low attenuation while signals with higher frequencies incur substantially attenuation, i.e. blocked/reflected at the beginning of the channel due to high impedance. Element 375 represents a coupled line providing a band-pass frequency response. The circuit elements residing below the transmission line 355 and peninsula 305 combine to provide a frequency response of a bandpass filter, e.g. signals within 11 GHz-20 GHz fall inside the bandpass frequency range and are coupled with low attenuation while frequencies outside the range, i.e. 0.5 GHz-10 GHz signals are substantially attenuated, i.e. blocked/reflected at the beginning of the channel due to high impedance.

As seen in FIG. 4, vias in the bottom metallization connect to the U-shaped ground loops to enhance the effective ground between the two metal layers. The top cavity 330 contains a plurality of metal traces 126 disposed in the top metal layer that function as selective frequency circuits to output port 145 where the selective frequency circuits provide low attenuation to signals between 0.5 GHz-10 GHz while providing a high impedance and substantial rejection to signals between 11 GHz-20 GHz. Similarly, the bottom cavity 335 contains a plurality of metal traces 126 disposed in the top metal layer that functions to form selective frequency circuits to output port 150 where the selective frequency circuits provide high impedance and substantial attenuation to signals between 0.5 GHz-10 GHz while providing low attenuation to signals between 11 GHz-20 GHz. Preferably, the substrate core is silicon carbide on which is disposed high precision metallization and through-wafer vias which can be produced using the same fabrication is used for gallium nitride (GaN) high electron mobility transistor (HEMT) production.

Figure 5:
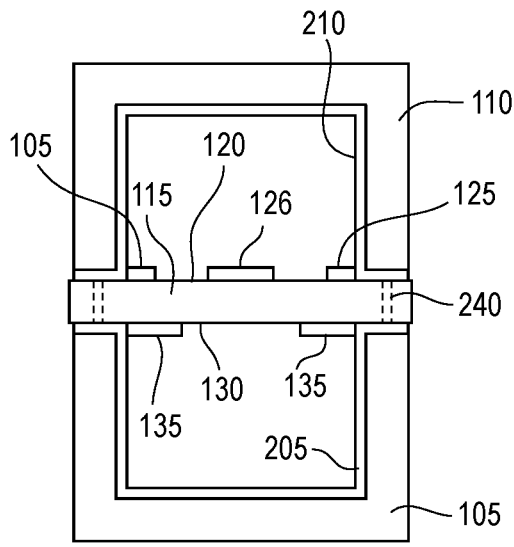
FIG. 5 shows a representative cross-section of an assembled filter in accordance with the embodiment of the present invention.

FIG. 5 shows a representative transverse cross-section of an assembled filter in accordance with the embodiment of the present invention where the cross-section is taken at a location on the assembled filter where the peninsula 155 does not exist. The bottom enclosure 105 and the top enclosure 110 may be made of silicon with the interior surfaces 205 and 210 comprising a plated gold lining. The gold-plated surfaces of the bottom and top enclosures engage the bottom metallization 135 and the top metallization 125, respectively. A conductive via 240 through the substrate provides a continuous ground connection interconnecting the gold-plated cavities of the bottom and top enclosures as well as the top and bottom metal layers that are to be ground potential. The substrate 120 is preferably silicon carbide or another material having properties that change very little with temperature in order to minimize any frequency response variation with changes in temperature. The suspended strip line circuitry having a large cross-section filled with low loss material (air, silicon carbide) facilitates a very high Q, enabling low loss filters with sharp band edges and rejection roll-off.

Figure 6:
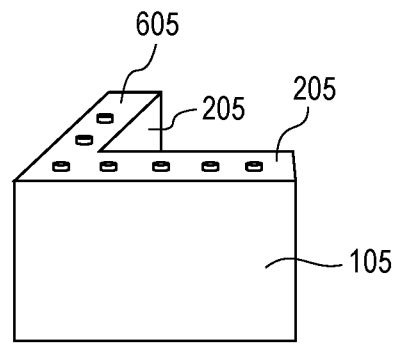
FIG. 6 shows an enlarged corner of an exemplary enclosure in accordance with an embodiment of the present invention.

FIG. 6 shows a representative enlarged corner of the bottom enclosure 105 with metal plating 205 that is disposed on the vertical sidewalls as well as the upward facing planar surfaces. Bonding bumps 605 extend generally perpendicular and outward from the upward facing planar surface along the peripheral edges and along the interior peninsula. Bonding bumps 605 are spaced apart along the entire periphery of the bottom enclosure and engage with the bottom metallization 135 in the assembled position. The bonding bumps also extend along the peninsula 155 of the bottom enclosure and engage the bottom metallization 405 in the assembled position. Similarly, bonding bumps extend perpendicular and outward from the downward facing planar surfaces of the top enclosure and engage the ground metallization 125 and ground peninsula metallization 305. In this example, the bonding bumps are formed on the enclosures rather than on the substrate (or metallization on the substrate) however it is potentially possible for the bonding bumps to be formed on both sides of the substrate 115. The bonding process preferably uses the highly accurate thermal compression bonding using a tool such as the FC-300 manufactured by SET for bonding of the gold-plated bonding bumps to the gold-plated metallization surfaces on the substrate. If the bonding bumps were disposed on the substrate, the second side to be bonded would have a much higher density of bumps so that the opposing bonding bumps on the other side of the substrate to be used for the other of the bottom and top enclosures would not be crushed during the process of applying pressure to create the bonding of the first enclosure to the substrate.

FIG. 7 shows an enlarged detail 700 of topside metallization associated with ports 140, 145 and 150 used to couple signals to and from the filter. These three ports are designed for probe-measuring. As an example, the port 140 is a ground-signal-ground port used to couple the input signal. As seen in this detail, the U-shaped ground metallization 315 provides a continuous 270° encircling of the input port center conductor 140. In this example an external probe or interconnect 705 includes a center metal conductor (finger) 710 disposed to engage the input port center conductor 140 and includes two opposing metal fingers 715 on either side of center finger 710 disposed to engage opposite legs of the U-shaped ground metallization 315. This structure of the ports provides the necessary compensation features such as inductance and capacitance in close proximity that allows a smooth transition of the field in the probe to that on the signal carrying traces on the substrate, and hence forming a "transition" from the probe to the brief microstrip (i.e., a transmission line with ground metallization on the backside of a substrate) and to the suspended stripline.

Figure 8:
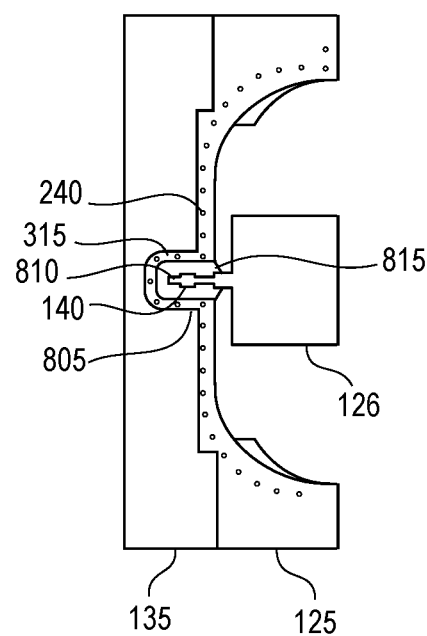
FIG. 8 shows an exploded detail view of the structure that supports a high-performance transition between an external microstrip transmission line and the suspended strip line in the embodiment of the present invention.

FIG. 8 shows an exploded detail view of the structure that supports a compact, high performance wide-band transition between an external microstrip line and the suspended strip line in the embodiment of the present invention. The field in the probe tip is between the signal pin and the ground pins, in a horizontal direction. To receive the pressure from probe landing, the lower cover must not have excavation in this region, and as such, microstrip type of transmission line, i.e., one with metallization (ground) at the backside of the substrate, must be used near the probe landing area. The vias 240 and the ground loop 315 help "folding" or "bending" the essentially horizontal field at the probe tip to the essentially vertical field under the microstrip trace. The neck-down 805 next to the probe pad 140 and the tail-end piece 810 are both features that help impedance match for wide-band performance. Next is the junction between the microstrip and the strip line where the essentially vertical field concentrated under the microstrip trace must fan out to all direction (downwards, upwards, sideways, etc.) in the suspended strip line that has an order of magnitude larger cross section than the microstrip. This field fan-out is assisted by the following features. The wedge-shaped metallization 815 on the backside of the substrate can be viewed as a "diving board" that allows the concentrated microstrip field to gradually loosen up and make connection to the much larger ground structure in the strip line. The tapering of both top and bottom covers provides to the field lines a landing surface in close proximity near the microstrip-stripline juncture and gradually expands the landed field to a larger cross section until it fills the full channel dimensions. It should be noted that due to the small distance and hence strong interactions between the probe-to-microstrip transition and the microstrip-to-stripline transition, these should be viewed and designed as a single transition, i.e., the probe-microstrip-stripline transition. Other transitions have also been designed for practical purposes such as for ribbon bonding or ribbon bonding and probing. Those transitions may have different dimensions or ground via arrangement. But the essential field bending/expanding features such as the wedge and the tapering ground remain very effective.

Figure 9A:
FIGS. 9A-9G show processing steps for manufacturing the exemplary enclosures.
Figure 9B:
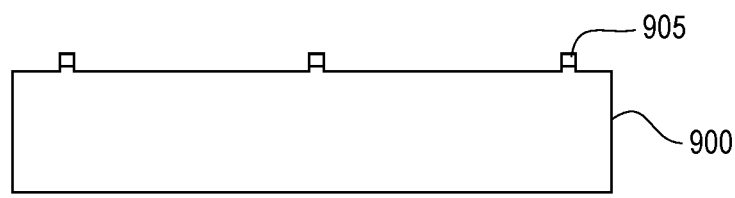
Figure 9C:
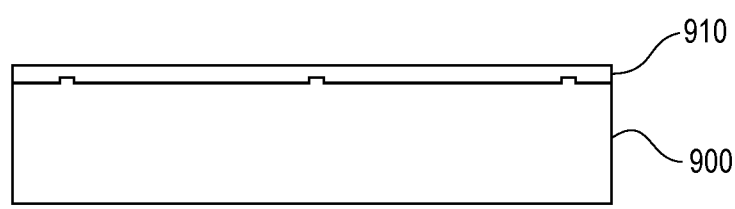
Figure 9D:
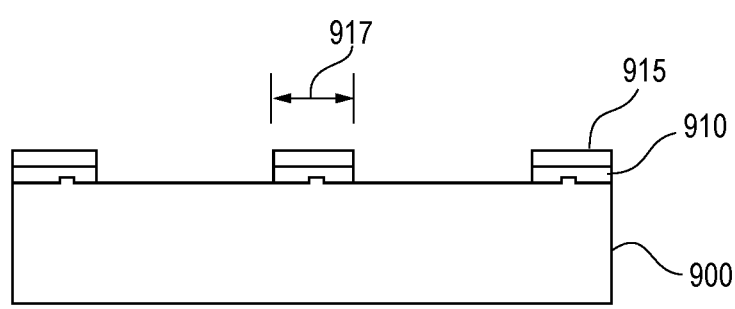
Figure 9E:
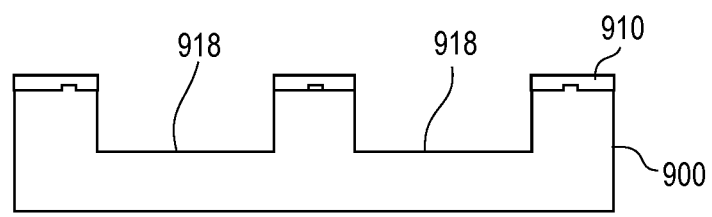
Figure 9F:
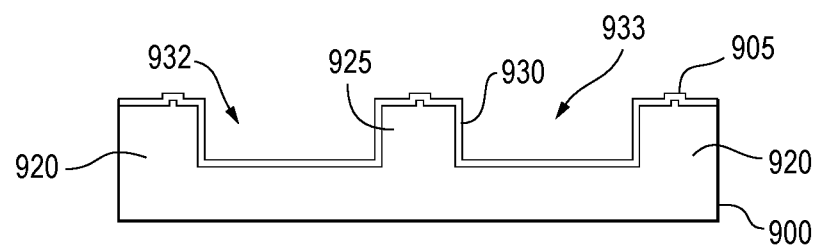
Figure 9G:
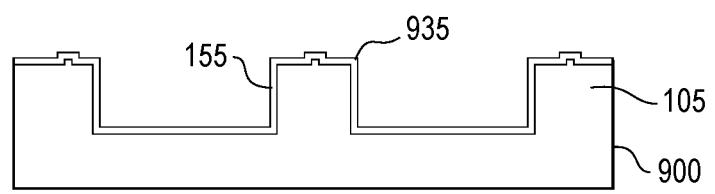

FIGS. 9A-9G show processing steps for manufacturing an exemplary enclosure associated with the filter in accordance with an embodiment of the present invention. In this example, the exemplary cross-section of a lower enclosure 105 is shown at a location so that the peninsula wall 155 is also shown. In FIG. 9A the process begins with a relatively thick silicon wafer 900, e.g. 1 mm. In a next step as shown in FIG. 9B the top surface of the silicon wafer 900 is patterned with photoresist and reactive ion etching (ME) is used to micromachine regions of the silicon to be removed, i.e. leaving the outwardly extending bonding bumps 905. "Micromachining" refers to creating a dimensionally accurate and smooth surface by semiconductor etching followed by deposition of a layer of metal. In the next step shown in FIG. 9C the photoresist is removed and a layer of oxide 910 is deposited with a thickness adequate to resist complete erosion during the silicon etching. Then, as shown in FIG. 9D photoresist pattern 915 is applied to create what will become three walls 917 and RIE is used to etch away the oxide 910 not protected by the photoresist. As shown in FIG. 9E the photoresist 915 as shown in FIG. 9D is removed and deep RIE etching is used to remove regions of the silicon that will form the interior recesses 918 in the enclosure. In FIG. 9F the oxide 910 is removed revealing 2 longitudinal walls 920 along the longitudinal edges and a centered, longitudinal peninsula wall 925 that form two separated longitudinal recesses 932, 933. The recesses may be up to approximately 40 mils deep with the exemplary diplexer embodiment etched to a depth of 15 mils. This is followed by sputtering a relative thin layer of gold 930 across all of the exposed upward facing surfaces including associated ends of the walls, bonding bumps, vertical walls and planar recesses. Thus, the exposed ends of the walls 920 and 925 as well as the bonding bumps and recess areas are all sputtered with gold. In the final step as shown in FIG. 9G all of the areas previously sputtered with gold are now plated with a thicker layer of gold. In this example, bonding bumps have a diameter of 25 μm, a bump height of 1.6 μm and are preferably spaced apart by a distance of 200 μm. Usually, the maximum spacing is about a quarter wavelength but a tenth of a wavelength is preferred, if feasible.

The superior degree of dimensional accuracy, and the surface smoothness of the interior recesses and surfaces interior of the enclosures achieved by the micromachining is critical to the ability to manufacture filters that have highly repeatable characteristics and performance and that have low electrical loss. Enclosures made by traditional mechanical manufacturing techniques such as machining, EDM, electroform, etc., have a tolerance in the range of 0.2 mils to 1 mil, which is one to two orders of magnitude larger than the precision provided by the semiconductor technology described herein. Additionally, surface roughness from machining may typically be 5 times higher than roughness achieved by semiconductor technology, which leads to additional RF signal loss. For example, the micromachined interior surfaces in the exemplary enclosures have a peak to valley roughness of less than 2 μm, i.e. 1.3 μm, as compared to a machined copper housing with a peak to valley roughness of about 9.4 μm. This provides a more than 7 times improvement in smoothness.

Although a conductive epoxy paste can be utilized to achieve assembly of the silicon and SiC, the conductive paste provides a more difficult technique to control in terms of ooze-out, thickness variation, air voids and poor electrical contact, etc., as well as placement accuracy.

With respect to the vias, 50 μm diameter metallized through-wafer vias connecting ground metallization on opposing surfaces on the substrate are used to form high-isolation electromagnetic via fences. Simulation has indicated that the vias can be used to provide high isolation up to 100 GHz when spaced at a minimum of 100 μm pitch. The via fence and the gold-plated silicon enclosure walls allow individual elements of the two separated frequency circuits to be effectively put into their own electromagnetically shielded cavities to minimize cross coupling. The through-wafer vias promote substantially continuous ground continuity for the RF return currents between the top and bottom enclosures and enables probe testing of the filter after fabrication. It should be noted that the "wall" formed by the gold-plated silicon enclosure walls and the via fence not only can be used to isolate channels, but also can be used to isolate individual filter elements. Traditional open-face printed filter designs often incur longer design cycles because proximity coupling among filter elements makes guesswork and repeated simulation cycles inevitable in fine-tuning the filter geometry. Isolation between individual filter elements eliminates such undesired cross coupling and hence allows for rapid development and compact layout.

As seen in Table 1, tight fabrication tolerances are important to design success on a first pass and to manufacturing repeatability, especially for filters which require tight cutoff specifications, high isolation requirements, and highly repeatable performance.

TABLE 1

| | | |
|---|---|---|
| SIGNAL LINE PRECISION ON SUBSTRATE | LINEWIDTH | +/−1 μm |
| | METAL THICKNESS | 3.5 or 5.5 μm, +/−0.5 μm |
| SILICON DRIE CAVITY PRECISION | CAVITY WIDTH | +/−3 μm |
| | CAVITY DEPTH | up to 40 mil, +/−10 μm |
| ALIGNMENT OF SUBSTRATE TO ENCLOSURES | | +/−5 μm |

Figure 10:
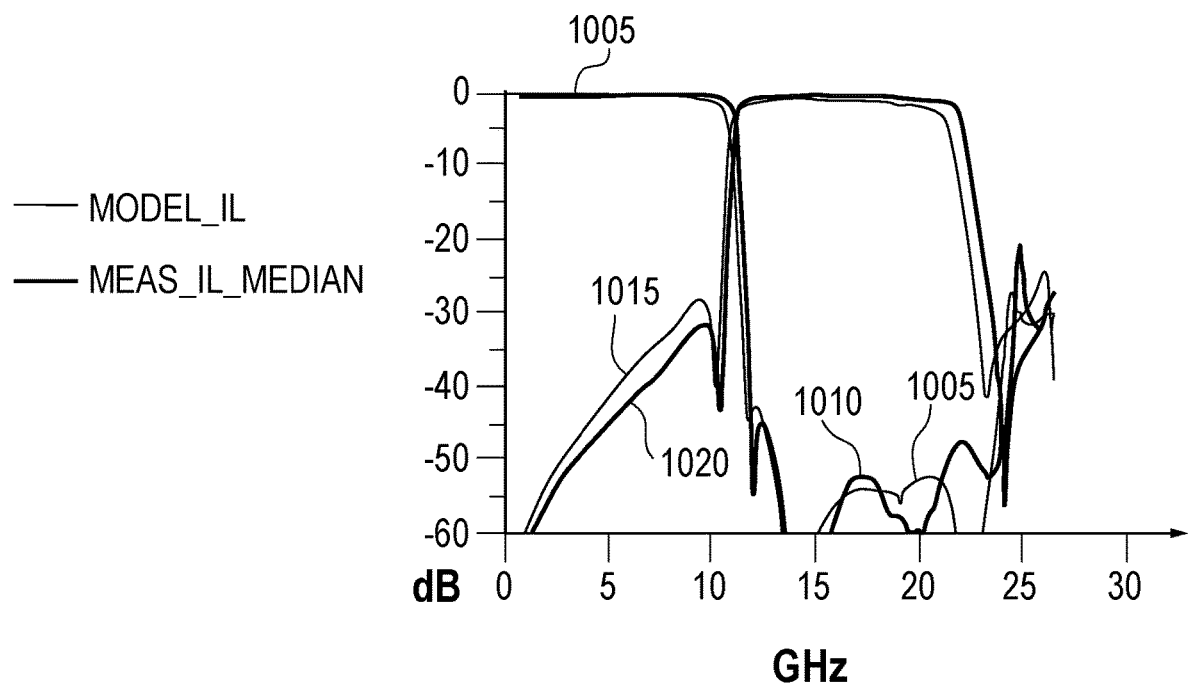
FIG. 10 shows a graph illustrating performance characteristics of an exemplary filter over a frequency range in accordance with an embodiment of the present invention.

FIG. 10 shows a graph illustrating performance characteristics over a frequency range of the exemplary filter (diplexer). This graph is plotted as dB versus frequencies for the exemplary frequencies of interest, i.e. 0.5 GHz-25 GHz. Line 1005 represents the output characteristics associated with signals from output port 145 that shows very low loss for input signals between 0.5 GHz and 10 GHz with a sharp increase of attenuation at approximately 11 GHz resulting in the attenuation of approximately 50 dB from about 12 GHz-24 GHz. Line 1010 represents the projected characteristics for signals at output port 145 using the finite element frequency domain analysis tool "HFSS" from ANSYS, Inc. It will be apparent that an extremely close correspondence exists between the projected characteristics and the actual measured characteristics. This is due to the tight manufacturing tolerances discussed above. Line 1015 represents the output characteristics associated with signals from output port 150 that shows very low loss for signals between 11 GHz and 20 GHz with a sharp increase at approximately 11 GHz resulting in the attenuation of at least 30 dB (and greater with decreasing frequency) from about 10 GHz-0.5 GHz. Line 1020 represents the projected characteristics for signals at output port 150 using the same HFSS model as mentioned above. Again, it will be apparent that an extremely close correspondence exists between the projected characteristics and the actual measured characteristics. The close correspondence between the characteristics projected by model analysis and actual measured characteristics of fabricated diplexers on a first pass of manufacturing represents outstanding design and fabrication techniques. The unit-to-unit variations of first pass fabricated diplexers was also remarkable, with 7 of 8 fabricated units showing nearly identical performance.

Although the above exemplary implementations of the invention have been depicted and described in detail herein, it will be apparent to those skilled in the art that various modifications, additions, substitutions, and the like can be made without departing from the spirit of the invention. For example, other microwave circuits including those mentioned earlier can be realized. The silicon cavity can be different heights and the bonding bumps can be made using various chip and wafer bonding techniques including eutectic bonding such as indium-gold or gold-tin, or copper pillar bonding. The bonding bumps could be fabricated on the substrate 115 instead of the silicon and the assembly can be bonded as an entire wafer rather than in smaller filter-sized blocks. The cavity height is only limited by the fabrication capability of the silicon etching tool. A silicon cavity with two different etch depths is possible and could be used in a terahertz waveguide device and could be used in the type of filter described herein. The substrate 115 could be made of another material such as 5 mil thick alumina, as long as there are through-wafer electrically conductive vias.

Figure 11:
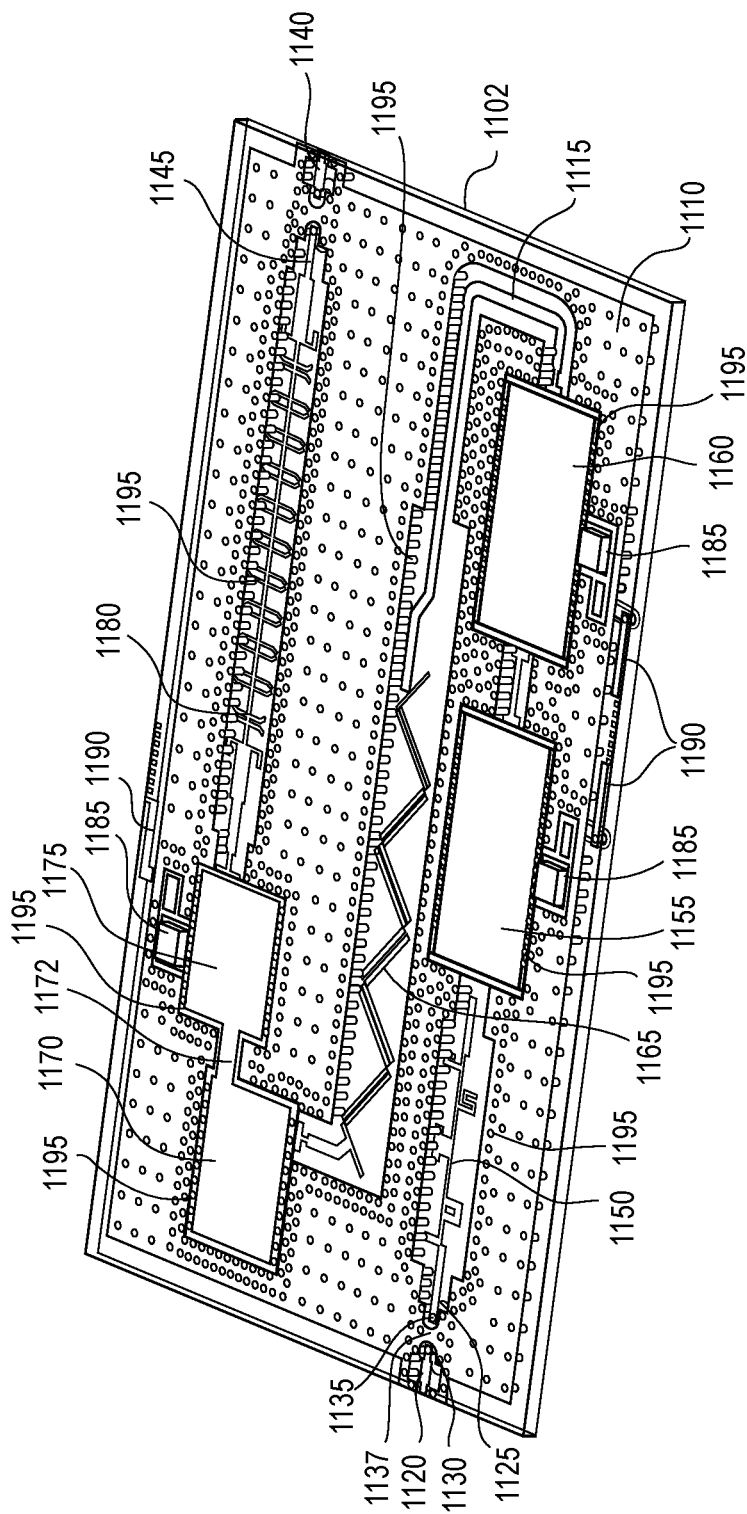
FIG. 11 shows an exemplary substrate for an RF module in accordance with an embodiment of the present invention.
Figure 16:
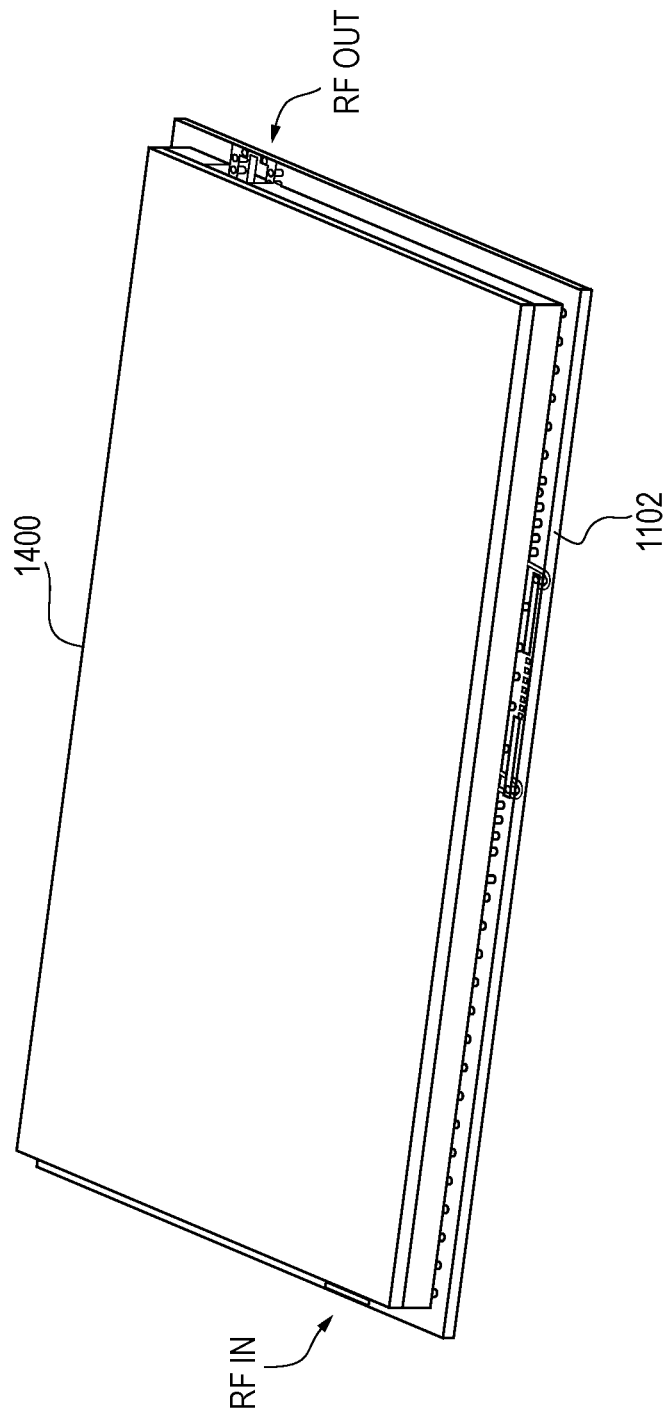
FIG. 16 shows a perspective view of the fully assembled RF module in accordance with the present invention with the cover engaging the substrate.

FIG. 11 shows an exemplary substrate 1102 for an RF module 1100 (as seen in FIG. 16) in accordance with an embodiment of the present invention. The exemplary RF module is composed of several monolithic microwave integrated circuits (MMIC) as well as three filters and a chip attenuator that implements an amplified, times two (×2) frequency multiplier that could, for example, provide a local oscillator RF signal at its output.

A planar dielectric substrate 1102 such as single crystal silicon carbide has top and bottom major surfaces with the top surface being shown in FIG. 11. Topside metallization 1110 defines both signal and ground for the RF signals that traverse elements disposed on the substrate 1102. A plurality of interior metallization traces 1115 not connected to ground provide a transmission path for the RF signals as well as defining electrical components, e.g., filters, transmission lines, etc. It can be observed that near the peripheral edges of topside metallization 1110, a continuous uninterrupted conductive ground path exists making it possible in cooperation with the cover 1400 to provide an effective uninterrupted RF ground seal about the periphery enclosing the interior electrical components. The through-wafer vias 1195 in the substrate 1102 provide an effective ground fence transverse to the major surfaces of the substrate because the spacing between adjacent vias is much less than ¼ wavelength, e.g., 0.1 wavelengths, at frequencies used in the RF module. Preferable, the thickness of the substrate and the spacing of the vias are chosen so that such upper frequency limit is beyond the highest frequency signal or spurs generated in the module during operation. In addition to the RF isolation provided, such a seal also prevents dust and other contaminants in the exterior environment from entering into the interior which could lead to degradation or failure of the RF module.

Ports that couple input and output signals provide challenges with regard to maintaining RF isolation and preventing external contaminants from entering the interior of RF modules. The conductive input port 1120 must be connected to the first electrical component 1125, e.g., a filter, while still facilitating RF isolation and physically sealing of the interior. As best seen in the exploded section shown in FIG. 12, a plated through via 1130 connects the top side conductive input port 1120 to bottom side metallization 1122 which connects through plated through via 1135 to the top side first electrical component 1125. As seen in FIG. 11, an area 1137 above metallization 1122 on the top side is covered with ground metallization 1110. This area allows corresponding engagement with a conductive wall of the cover 1400 to maintain a continuous RF ground and physical seal near the periphery on the top surface of the substrate while still permitting the input signal to be coupled to the corresponding first electrical component. The conductive output port 1140 is coupled to the last electrical component 1145 in like manner to the input port. DC voltages are preferably coupled in a like manner to interior active components to facilitate an uninterrupted RF ground and physical seal of the cover about the periphery of the substrate 1105. Such routing of the RF signal paths could be considered an inverted bridge.

The exemplary RF module 1100, an amplified ×2 multiplier, uses a series low-pass filter 1150 to filter an input RF signal at a base frequency which will be multiplied ×2 and amplified by the RF module. This filter provides low attenuation to the base frequency signal while providing substantial attenuation at the ×2 frequency. Two GaAs high electron mobility transistors (HEMT) circuit die 1155 and 1160 provide amplification of the base frequency RF signal which is then bandpass filtered by filter 1165. The amplified based RF signal is coupled to an InP diode circuit die 1170 used as a frequency multiplier having an output coupled to an attenuator die 1172 followed by another GaAs HEMT amplifier 1175 with its output connected to bandpass filter 1180 before being coupled to the signal output port 1140. The attenuator 1172 reduces reflections back from the amplifier die 1175 into the multiplier die 1170, hence providing a better "matched" load to the multiplier circuit 1170. Bandpass filter 1180 provides low attenuation to the ×2 frequency signal but provides substantial attenuation, e.g., 60 dB, to the base ×1 frequency signal thus minimizing its amplitude at the output port relative to the amplitude of the ×2 frequency signal.

Each of the three amplifiers 1155, 1160, 1175 have a corresponding DC voltage input 1190 and corresponding chip capacitors 1185 to minimize any RF signal on the DC input voltages. Three-dimensional or vertical "fences" 1195 formed of closely spaced in-line metal plated through hole ground vias connecting top and bottom conductive ground areas are preferably disposed along the lateral edges of the three microstrip filters to present an effective ground surface between top and bottom grounds and high isolation to all other components. Similarly, vertical fences 1195 are preferably disposed close to the perimeter of the amplifiers and the multiplier diode. Thus, all of the components such as active components: amplifiers and multipliers, and passive components: filters and attenuators, are enclosed in their own respective "cavity" that provides isolation to other components. Furthermore, since the cavity tightly delineates the outline (lateral periphery) of each chip/component as close as semiconductor manufacturing permits, it provides the smallest cavity (other than a margin for manufacturing tolerance) that pushes the resonance of the cavity to a much higher frequency than that could be achieved with a typically much larger cavity formed by machining a metal housing. The amplifier ICs and the diode multiplier are attached, e.g., by an automated pick and place tool, to respective ground areas on the top surface such as by conductive epoxy and the signal/control lines may be ribbon bonded to respective conductor areas on the substrate 1102.

Figure 12:
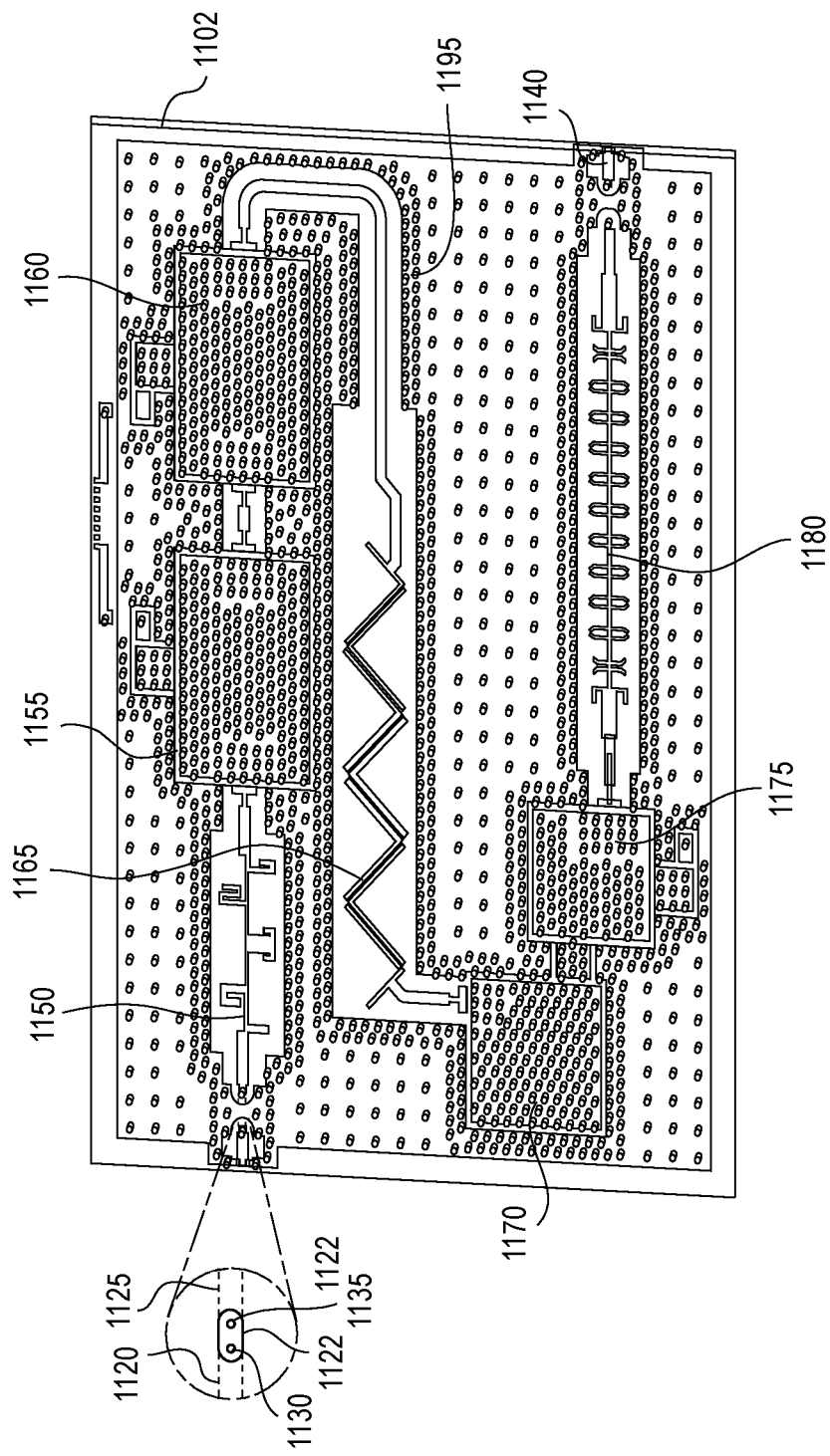
FIG. 12 shows the other major surface of the embodiment of FIG. 11 with back side metallization removed.

FIG. 12 shows the other major surface of the substrate of FIG. 11 with back side metallization removed to better show the plated through-hole vias that connect the back side ground metallization with the top side ground metallization. The vertical fences 1195 consisting of closely spaced in-line plated through-hole vias may be more easily seen in this figure. Ground through hole vias in ground areas under which the amplifiers and multiplier diode modules are mounted enhance the grounding.

Figure 13:
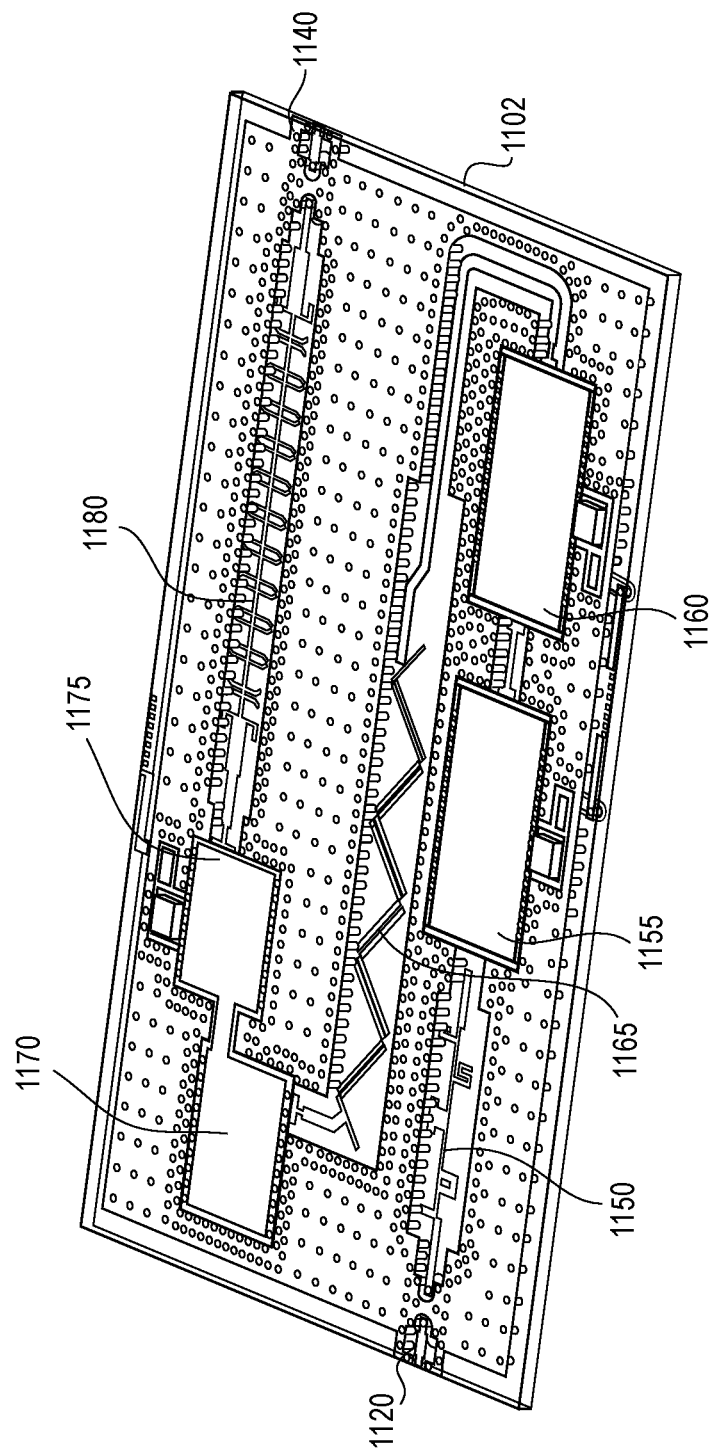
FIG. 13 shows the embodiment of FIG. 11 with added components.

FIG. 13 shows the embodiment of FIG. 11 with MMIC die components having been added. That is, the three amplifier circuit die, the attenuator circuit die, and the multiplier diode circuit die are mounted with conductive epoxy and electrically connected by ribbon bonds to corresponding conductive pads. Any other separate components, e.g., bypass capacitors, etc. will also have been mounted, e.g., epoxied and wire bonded. In order to increase the Q and minimize loss in the three filters, the three microstrip filters are preferably formed as part of the substrate fabrication, and are printed on the surface of the substrate at the same time as all of the rest of the frontside metallization. Such "integrated" or "printed" filters are preferred whenever possible in order to reduce part count, to save effort in chip attach and ribbon bonding, and to obtain high accuracy in performance without variations caused by chip attachment and ribbon bonding. Alternatively, filters could be separately fabricated and bonded to the surface of the substrate.

Figure 14:
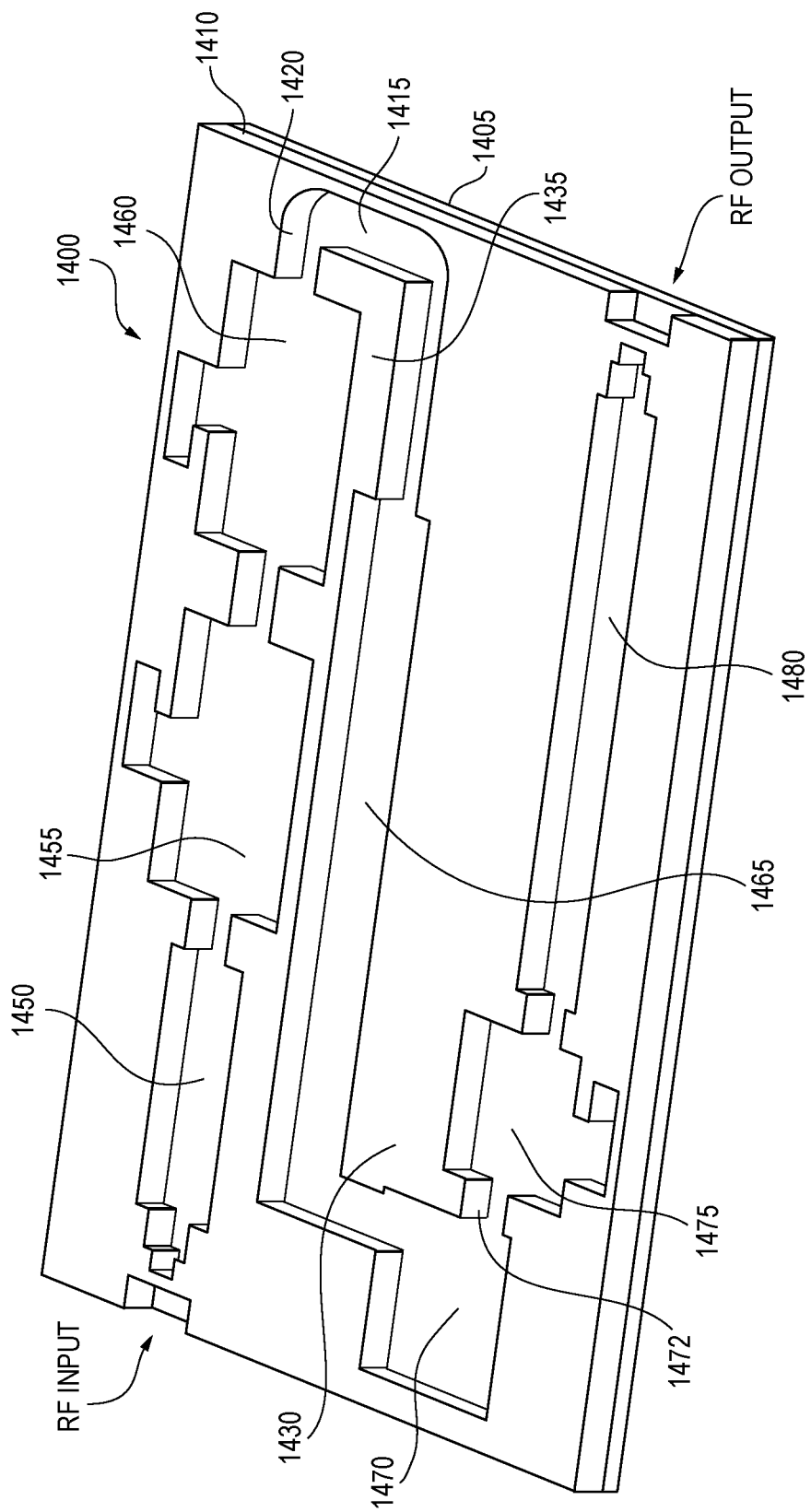
FIG. 14 shows an exemplary cover in accordance with an embodiment of the present invention with channels and recesses located to enclose respective components on the substrate of the RF module to provide respective RF isolation.

FIG. 14 shows an exemplary cover 1400 in accordance with an embodiment of the present invention with reference numbered recesses 1450-1480 located to individually enclose corresponding components 1150-1180 on the substrate 1102 to provide RF and magnetic isolation of the components from each other and from the external environment when the cover is mounted to and engages the substrate 1102. The cover 1400 is preferably made of a silicon wafer 1405 having a planar surface 1410. The bottom 1415 and the sidewalls 1420 of the recesses as well as the planar surface 1410 are plated with a conductive metal, e.g., gold.

Starting with the previously described inverted bridge structure at the RF INPUT, a continuous recess channel extends and meanders to the inverted bridge structure at the RF OUTPUT. The continuous recess, when the cover is attached, encloses the mounted electronic components and integrated filters on the substrate, and also encloses interconnections therebetween. Because the cover provides electrical and magnetic isolation between electrical elements, the layout of the elements can be folded to allow for an RF module with a minimized area. With regard to the direction of signal flow as seen in FIG. 13, the signal flows left to right through filter 1150, amplifiers 1155 and 1160, makes a 180° turn and flows right to left through filter 1165 into the diode multiplier 1170, and makes a final 180° turn flowing from left to right through amplifier 1175 and filter 1180. As best seen in FIG. 14, peninsulas 1430 and 1435, in combination with the RF grounding provided by the substrate, provide signal isolation allowing for the signal path to undergo two 180° turns to minimize the area occupied by the electrical components. In this exemplary embodiment, the three MMIC chips 1170, 1172 and 1175 are placed right next to each other with the minimum spacing allowed by semiconductor manufacturing, and ribbon bonded to each other without going through an intermediate trace on the substrate. Such "chip-to-chip" bonding can be used to save space. By comparison with machined housing, it is unlikely, if not impossible, to achieve the level of necking down (abrupt controlled physical transitions) of 1472. Thus, with a machined housing, the three MMICs 1470, 1472, and 1475 would likely end up sitting together in a single common larger cavity that would likely result in an undesired lower resonant frequency associated with the cavity. The techniques shown in the current embodiment of the invention provide semiconductor-controlled tolerances which allows what would have been a single larger cavity in a machined housing to be broken into separate smaller cavities and hence avoids concerns associated with a larger cavity, e.g., lower resonant frequency, etc.

Figure 15:
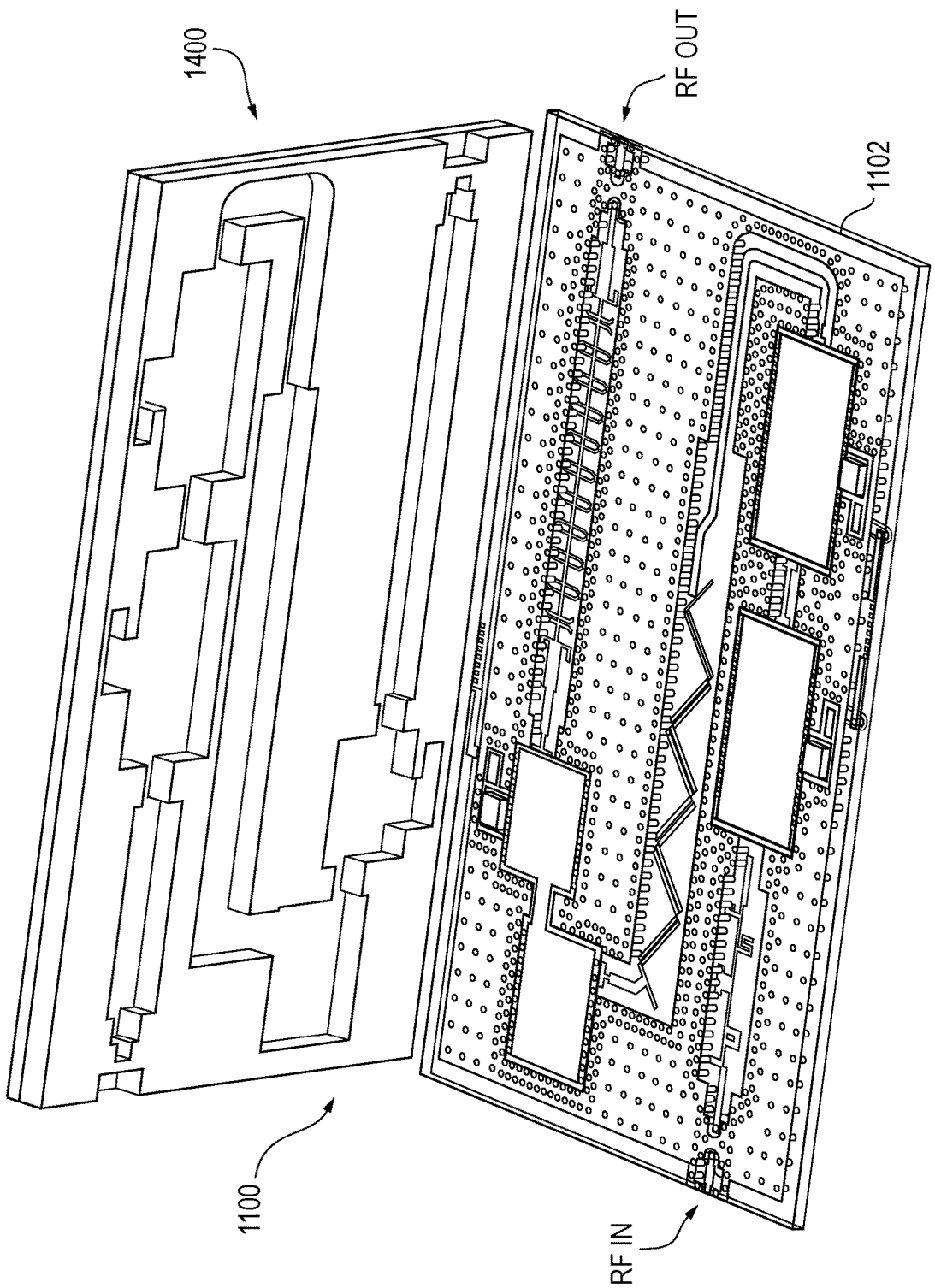
FIG. 15 shows a disassembled perspective view of the RF module in accordance with the present invention with the cover opened.

FIG. 15 shows a disassembled perspective view of the RF module 1100 with the cover 1400 shown in a position ready for assembly and engagement with the top surface of the substrate 1102. It will be seen that the recesses in the cover will be aligned to provide a seal around the respective electrical components.

FIG. 16 shows a perspective view of the finally assembled RF module 1100 in accordance with the present invention with the cover 1400 engaging the substrate 1102. It is, of course, important that the metallization on 1410 of the cover 1400 physically and electrically engage the respective top side metallization 1110 of the substrate 1102 to provide electromagnetic isolation for the electrical components. This engagement also provides a continuous physical seal near the periphery of the RF module to protect against infiltration of outside contaminants. This binding is preferably accomplished using a high accuracy chip bonder to form gold-to-gold thermocompression bonds between the abutting surface plating on the substrate and on the cover. Preferably, at least one of the surfaces of the two abutting surfaces will contain bonding bumps as explained above to enhance the making of the thermocompression bonds. Alternatively, another technique could be used to conductively bond the cover to the ground metallization of the substrate, e.g., conductive epoxy, etc. The chip bonder provides an acceptable placement accuracy of the cover relative to the substrate, e.g., 0.5 mil.

The RF module is made using semiconductor wafer fabrication processes. This process produces components, especially but not limited to the cover, that are dimensionally much more precise and repeatable than other processes, e.g., a cover made by bending a sheet of metal or by mechanically drilling/removing metal from a block of metal to create a cavity. The substrate may utilize a silicon carbide wafer with front (top) side conductive plating consisting of a 3.5 um of gold, with the dimensional accuracy of 0.5 um linewidth. The substrate backside process may consist of thinning the substrate to 254 um and using inductively coupled plasma to etch through-wafer vias with a diameter of 150 um, and then patterning gold plating of 3.5 um with a dimensional accuracy of 2 um linewidth.

The cover may consist of a silicon wafer of 40 mil thickness that is micromachined and plated with gold. The recesses (cavities) can be deep reactive ion etched (DRIE) to a depth of 25 mil using photolithography by patterning a silicon dioxide masking layer which has an etch selectivity of greater than 100:1. After completion of the DRIE etch, which can provide nearly vertical, smooth sidewalls of the recesses, the entire surface of the etched cover that will ultimately engage the substrate can be plated with 3.5 um of gold. The cover 1400 which is part of the RF module 1100 can be manufactured using the same or a similar process as explained with regard to FIG. 9.

A cover utilized to provide electromagnetic isolation with a micromachined interior made using semiconductor fabrication provides repeatable dimensional tolerances limited only by the semiconductor manufacturing tolerances. Dimensional tolerances become a significant consideration when designing a circuit with active and passive electrical components that operate at high frequencies, e.g., frequencies of 1 GHz and higher. The ability to more precisely determine the height to width dimensions and volumes of the individual recesses associated with each electrical component means that the manufactured RF module can have substantially the same characteristics as projected by a design model. High-frequency RF modules fabricated in accordance with the micro-machining process described herein will likely require no unit-to-unit tuning in order to yield the designed characteristics.

Figure 17:
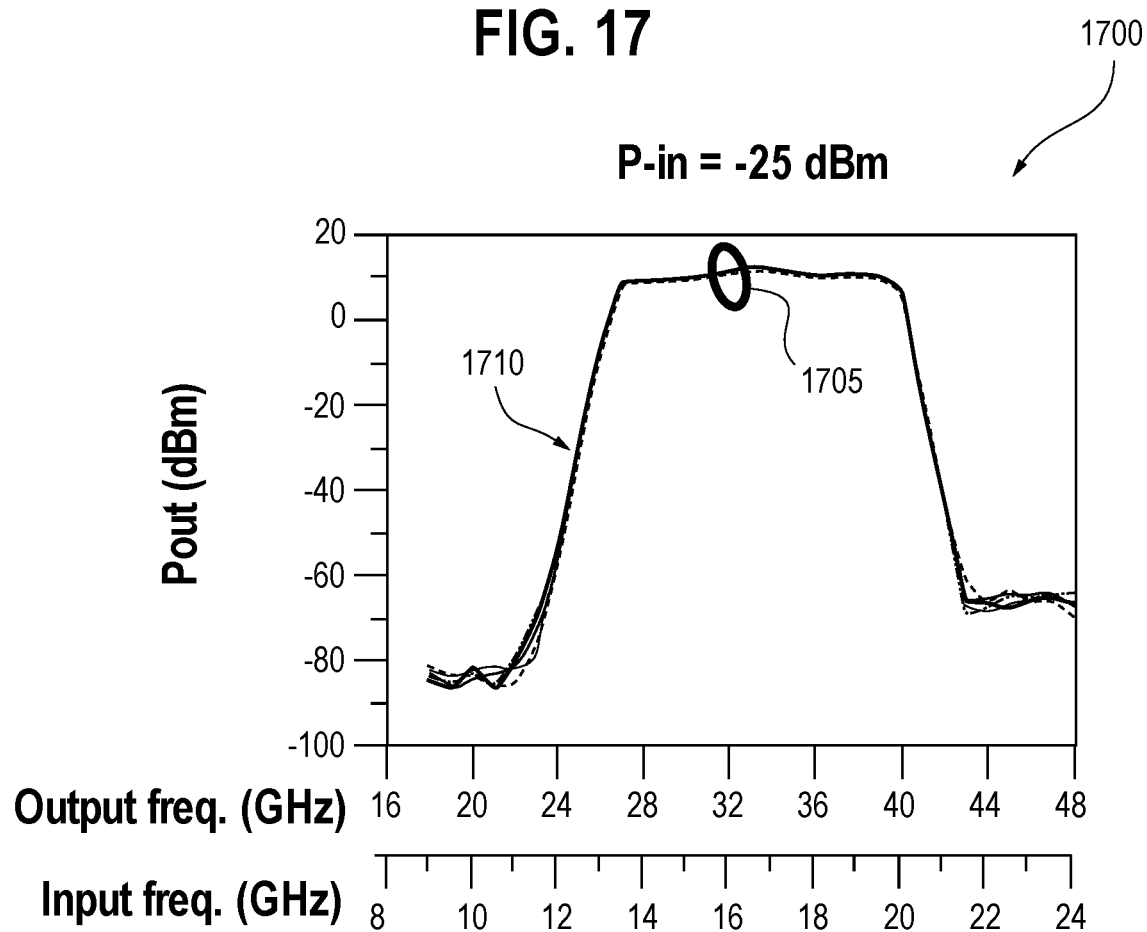
FIG. 17 is a graph of the output performance of the exemplary RF module.

FIG. 17 is a graph 1700 of the output performance of the exemplary RF module 1100. The y-axis shows power out in dBm and the x-axis shows both the output frequency and the input frequency in gigahertz for the ×2 frequency multiplier RF module. With an input frequency of 16 GHz, the output frequency is 32 GHz for the ×2 frequency multiplier. As shown at 1705, the power output at 32 GHz is approximately +10 dBm with a substantially constant power output between 27 GHz and 40 GHz. It will be seen that the power output is less than 60 dBm for frequencies below 24 GHz and above 42 GHz. Line 1710 represents the respective power output characteristics of five different RF modules 1100. The respective power outputs between 24 GHz and 42 GHz are so close as to be seen as a single line. Minor insignificant variations, as shown, exist below and above these frequencies for the respective RF modules.

Figure 18:
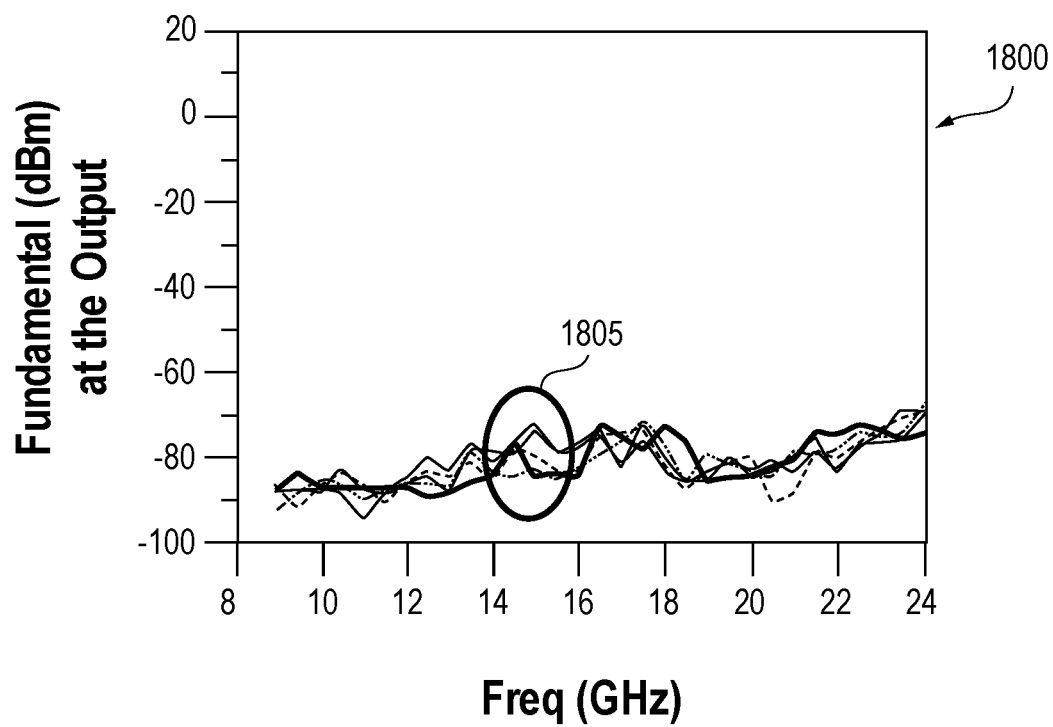
FIG. 18 is a graph showing the suppression of the fundamental frequency at the output of the exemplary RF module.

FIG. 18 is a graph 1800 showing the suppression of the 16 GHz fundamental frequency at the output of the exemplary RF module. As shown at 1805 of the graph, the input fundamental frequency of 16 GHz is less than −70 dBm at the output of the RF module. As explained with regard to FIG. 17, five different RF modules represented by the 5 respective lines as seen in this graph show only minor insignificant differences in levels. As shown in FIGS. 17 and 18, the extremely close performance of the five different manufactured ×2 frequency multiplier RF modules demonstrates the repeatable performance achieved without individual tuning of the RF modules by the precision of the components, especially the filters, the repeatable precise dimensions of the respective recesses in the enclosures, and the physical alignment of the recesses relative to the respective components.

Although the exemplary RF module 1100 provides amplified ×2 frequency multiplier, it will be apparent that a variety of other types of RF modules using active, passive, or active and passive electrical components will benefit from the described micro-machining fabrication. For example, a broadband or limited bandwidth RF amplifier, an RF mixer, and high-speed switching circuitry can benefit from the unit-to-unit repeatable electromagnetic shielding provided by such an enclosure. Also, additional shielding protection can be employed by using a second enclosure making a sandwich with a substrate to add shielding for both major surfaces and for components that may reside on both surfaces of the substrate. Since physical dimensions become increasingly important influence on associated RF fields as the operating frequency increases, high-frequency circuitry, e.g., circuits operating at higher than 1 GHz, will derive enhanced repeatable unit-to-unit performance when modules are constructed using the subject micro-machining fabrication process. Another advantage is that the module can be probe tested before it is integrated into the next higher assembly. Other benefits compared to a module that uses a machined cover are lower cost (fewer components, no tuning), small size and weight, and faster assembly.

The module design is simplified, reducing the time and cost for NRE (non-recurring engineering) mainly due to the high-accuracy, predictable construct of the module. For example, traditionally the most time-consuming part of filter design is iterations used to compensate the undesired mutual coupling among filter elements through the air and substrate. In contrast, in the exemplary semiconductor RF module, each filter element resides in its own individual cavity and is isolated from neighboring elements. This construct substantially eliminates the mutual coupling between components, and allows the design to proceed faster, say, from days to hours. Another reason for lower NRE cost is the predictable performance of the interconnections between components. For example, in a traditional machined housing, two MMIC chips are connected to each other via a piece of substrate carrying a length of transmission lines epoxied to the bottom floor of housing, with ribbon bonds formed at each end of the transmission line. In contrast, in the exemplary semiconductor RF module, the interconnecting line is "printed" on the top surface of the substrate, which eliminates variations in the additional substrates and the variation in the placement of such substrates. Using a numerically programmed ribbon bonder, the ribbon bonds formed in an automatic assembly line produces highly repeatable ribbon profiles, which when combined with high precision printed lines allows development of a design model that captures the entire "MMIC chip to transmission line with ribbon bonds" and can be simulated with high accuracy. Other design models, e.g., the probe-substrate transition, dive-under transition (as embodied by 1120, 1130, 1122, 1135, 1125), 90-degree bend, transmission line jogs, in-line series (blocking) capacitors, etc., can also be developed once and used repeatedly with predictable performance. The ability to accurately model what had been difficult to predict parts of the interconnects into known and repeatable characteristics brings the design flow to a "modular" regime and tremendously cuts down the design time.

The scope of the invention is defined in the following claims.

The invention claimed is:

1. A semiconductor technology implemented RF module comprising:
a substantially planar dielectric substrate;
metal traces disposed on both of two major surfaces of the substrate that function as a reference ground;
at least one frequency selective circuit and at least one active semiconductor component disposed on one of the two major surfaces;
other metal traces disposed on at least the one major surface of the substrate that connects the at least one frequency selective circuit and the at least one active semiconductor component;
an enclosure having a micromachined semiconductor fabricated interior with at least first and second interior recesses dimensioned to surround and provide electromagnetic isolation for the at least one frequency selective circuit and at least one active semiconductor component, respectively, with the enclosure mounted to the one major surface of the substrate, the enclosure having outwardly extending peripheral walls that include a substantially planar end areas that are parallel to the substrate, all interior surfaces of the enclosure including the substantially planar end areas of the enclosure and the interior recesses having a deposited conductive metal coating, the substantially planar end areas engaging the metal traces on the one major surface of the substrate so that interior recesses function as the reference ground;
the enclosure mounted to the substrate by metal-to-metal conductive bonds between the substantially planar end areas and the metal traces on the one major surface of the substrate so that the interior recesses also function as the reference ground to provide electromagnetic isolation for the at least one frequency selective circuit and at least one active semiconductor component.

2. The RF module of claim 1 further comprising a plurality of metal bonding bumps that extend outwardly from at least one of the planar end areas and the metal traces on the one major surface, the metal bonding bumps engaging both the respective reference ground metal traces on the one major surface and the planar end areas on the major surface with the enclosure, the bonding bumps being compressed due to bonding pressure to enhance metal-to-metal conductive bonds to establish a common reference ground with the deposited metal coating of the interior of the enclosure.

3. The RF module of claim 1 wherein the enclosure has about its peripheral edges a first extending contiguous peripheral wall with corresponding planar end areas that engage the metal traces disposed near the periphery of the one major surface of the substrate to provide a contiguous seal of the interior of the RF module against contaminants from an environment external of the RF module.

4. The RF module of claim 1 in which the enclosure further comprises at least one projecting longitudinal peninsula wall having one of the planar end areas, the at least one projecting longitudinal peninsula wall being a reference ground and electromagnetically separating any frequency selective circuits and active semiconductor components on one side of the longitudinal peninsula wall from other frequency selective circuits and active semiconductor components on the other side of the longitudinal peninsula wall.

5. The RF module of claim 4 wherein the at least one projecting longitudinal peninsula wall enables electromagnetic separation of a first signal path on one longitudinal side of the peninsula wall from a second signal path on the other longitudinal side of the peninsula wall facilitating a back-and-forth meandering of the first and second signal paths to minimize the total area of the substrate required for the RF module.

6. The RF module of claim 1 further comprising:
a plurality of through-hole conductive vias disposed to connect the metal traces on both major surfaces of the substrate that function as the reference ground;
a plurality of rows of the conductive vias with the vias in each row being contiguous to each other and being spaced less than 0.1 wavelengths of an RF signal in the RF module, the rows of vias disposed in the substrate near at least some of peripheral edges of the at least one frequency selective circuit and at least one active semiconductor component.

7. The RF module of claim 1 wherein the enclosure comprises a dielectric wafer with the interior recesses being semiconductor micromachined and metal having a peak to valley roughness of less than 2 microns deposited on the semiconductor micromachined interior.

8. A semiconductor technology implemented enclosure for providing electromagnetic shielding of electronic RF sensitive components disposed on a substantially planar dielectric substrate with metal traces disposed on at least one major surface of the substrate that function as a reference ground, the enclosure comprising:
a dielectric wafer having a micromachined semiconductor fabricated interior;
recesses in the interior are defined between outwardly extending peripheral walls on the interior, the peripheral walls have substantially planar end areas that are parallel to each other and are in the same plane, the recesses are dimensioned to surround and provide electromagnetic isolation for the respective electronic components when the planar end areas of enclosure engage the one major surface of the substrate;
a conductive metal coating deposited on all interior surfaces of the enclosure including the substantially planar end areas and the recesses;
the substantially planar end areas are dimensioned to engage the metal traces on the one major surface of the substrate so that, when engaged, the interior recesses form part of the reference ground.

9. The enclosure of claim 8 further comprising a plurality of metal bonding bumps that extend outwardly from the planar end areas, the metal bonding bumps dimensioned to engage respective reference ground metal traces on the one major surface, the bonding bumps being compressible under bonding pressure to enhance metal-to-metal conductive bonds.

10. The enclosure of claim 8 wherein the enclosure has about its peripheral edges a first extending contiguous peripheral wall with corresponding planar end areas that dimensioned to engage metal traces disposed near the periphery of the one major surface of the substrate, the enclosure, when engaged with the substrate, providing a contiguous seal of the interior of the RF module against contaminants from an environment external of the RF module.

11. The enclosure of claim 8 further comprising at least one projecting longitudinal peninsula wall having one of the planar end areas, the at least one projecting longitudinal peninsula wall located to provide electromagnetic separation, when the enclosure is mounted to the substrate, of a signal path on one side of the longitudinal peninsula wall from another portion of the signal path on the other side of the longitudinal peninsula wall to facilitate a back-and-forth meandering of the signal path to minimize the total area of the substrate.

12. The enclosure of claim 8 wherein the interior recesses are semiconductor micromachined and have deposited metal having a peak to valley roughness of less than 2 microns.

13. A method for manufacturing a semiconductor technology implemented enclosure that provides electromagnetic shielding of high frequency RF components disposed on a substrate when the enclosure engages the substrate, the method comprising the steps of:
  applying a coating to areas on a major surface of a silicon wafer where the areas define where walls of recesses will be located;
  etching away a layer of silicon not protected by the coating to a first depth, the silicon at the first depth defining the bottom of the respective recesses;
  removing the coating;
  sputtering the entirety of the exposed surface of the silicon wafer with gold so that sputtered gold coats the ends of the walls, bottom of the recesses, and the sides of the walls;
  plating the area covered by sputtered gold with gold.

14. The method of claim 13 further comprising the following steps to be performed prior to the steps in claim 13:
  applying another coating within areas on a major surface of a silicon wafer where the areas define where walls of recesses will be located, the another coating representing small isolated areas along the walls where bonding bumps will be located;
  etching away a first layer of silicon not protected by the another coating to a second depth, the silicon at the second depth defining the top of the walls;
  removing the another coating;
  the sputtering and plating steps are also applied to the bonding bumps.

15. The method according to claim 13 further comprising the surface of the plated gold in the recess having a peak to valley roughness of less than 2 µm.

16. The method according to claim 14 wherein the bonding bump to bonding bump spacing is less than ⅕ of a quarter wavelength of the highest frequency in use.

17. The method according to claim 13 wherein the etching is reactive ion etching.

18. The method according to claim 13 wherein the etching step is deep reactive ion etching.

* * * * *